(12) United States Patent
Miyasaka et al.

(10) Patent No.: US 9,487,440 B2
(45) Date of Patent: Nov. 8, 2016

(54) PROCESS FOR PRODUCING CHEMICALLY STRENGTHENED GLASS

(71) Applicant: ASAHI GLASS COMPANY, LIMITED, Chiyoda-ku (JP)

(72) Inventors: Junko Miyasaka, Tokyo (JP); Takahiro Sakagami, Shizuoka (JP); Seiki Ohara, Tokyo (JP); Kosho Akatsuka, Tokyo (JP); Manuel Reyes Diaz, Tokyo (JP); Kazutaka Ono, Tokyo (JP); Hiroyuki Hijiya, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 169 days.

(21) Appl. No.: 14/524,920

(22) Filed: Oct. 27, 2014

(65) Prior Publication Data

US 2015/0111030 A1 Apr. 23, 2015

Related U.S. Application Data

(63) Continuation of application No. PCT/JP2013/061853, filed on Apr. 23, 2013.

(30) Foreign Application Priority Data

Apr. 27, 2012 (JP) ................. 2012-104059
Nov. 2, 2012 (JP) ................. 2012-242555

(51) Int. Cl.
C03C 21/00 (2006.01)
H05K 5/03 (2006.01)
C03C 23/00 (2006.01)

(52) U.S. Cl.
CPC .......... *C03C 21/002* (2013.01); *C03C 23/007* (2013.01); *H05K 5/03* (2013.01); *Y10T 428/268* (2015.01); *Y10T 428/315* (2015.01)

(58) Field of Classification Search
None
See application file for complete search history.

(56) References Cited

U.S. PATENT DOCUMENTS

| | | | |
|---|---|---|---|
| 4,053,679 A * | 10/1977 | Rinehart | .......... C03C 3/062 428/218 |
| 8,093,167 B2 | 1/2012 | Yagi et al. | |
| 8,114,795 B2 | 2/2012 | Yagi et al. | |
| 8,153,270 B2 | 4/2012 | Akieda et al. | |

(Continued)

FOREIGN PATENT DOCUMENTS

| | | |
|---|---|---|
| CN | 101462829 A | 6/2009 |
| JP | 2009-61730 | 3/2009 |

(Continued)

OTHER PUBLICATIONS

Simmons et al. "Effects of Phase Separation on Crack Growth in Borosilicate Glass," Journal of Non-Crystalline Solids, 38 and 39, (1980) pp. 503-508.*

(Continued)

*Primary Examiner* — David Sample
(74) *Attorney, Agent, or Firm* — Oblon, McClelland, Maier & Neustadt, L.L.P.

(57) ABSTRACT

A process for producing a chemically strengthened glass is provided. The method for producing a chemically strengthened glass includes subjecting a phase-separated glass to an ion exchange treatment. A chemically strengthened glass which is obtained by the process and a phase-separated glass which has been subjected to the ion exchange treatment are also provided.

20 Claims, 14 Drawing Sheets

(56) References Cited

U.S. PATENT DOCUMENTS

| | | |
|---|---|---|
| 8,853,109 B2 | 10/2014 | Bogaerts et al. |
| 2008/0286548 A1 | 11/2008 | Ellison et al. |
| 2009/0068404 A1 | 3/2009 | Akieda et al. |
| 2009/0162608 A1 | 6/2009 | Yagi et al. |
| 2010/0035038 A1 | 2/2010 | Barefoot et al. |
| 2010/0215862 A1* | 8/2010 | Gomez ............... C03C 21/002 427/419.4 |
| 2011/0136651 A1 | 6/2011 | Yagi et al. |
| 2012/0111057 A1 | 5/2012 | Barefoot et al. |
| 2012/0196735 A1 | 8/2012 | Bogaerts et al. |
| 2012/0202040 A1 | 8/2012 | Barefoot et al. |
| 2014/0154439 A1* | 6/2014 | DeMartino ......... C03C 23/0095 428/34.4 |

FOREIGN PATENT DOCUMENTS

| | | |
|---|---|---|
| JP | 2010-1201 | 1/2010 |
| JP | 2010-527892 | 8/2010 |
| JP | 2010-195612 A | 9/2010 |
| JP | 2011-530470 | 12/2011 |
| JP | 2012-72048 | 4/2012 |
| WO | WO 2011/051257 A1 | 5/2011 |

OTHER PUBLICATIONS

Seal et al., "Effect of phase separation on the fracture toughness of $SiO_2$—$B_2O_3$—$Na_2O$ glass," Bull. Mater. Sci., vol. 28, No. 5. Aug. 2005, pp. 457-460.*

Fluegel et al. "Graded pore size by ion exchange of phase-separated 6.5 $Na_2O$ 33.5 $B_2O_3$ 60 $SiO_2$ glass," Glastech. Ber. Glass Sci. Technol. 73 (2000) No. 7. pp. 204-210.*

U.S. Appl. No. 14/685,131, filed Apr. 13, 2015, Miyasaka, et al.
U.S. Appl. No. 14/733,393, filed Jun. 8, 2015, Miyasaka, et al.
U.S. Appl. No. 14/732,975, filed Jun. 8, 2015, Miyasaka, et al.
International Search Report issued Jul. 23, 2013 in PCT/JP2013/061853 filed Apr. 23, 2013.

* cited by examiner

FIG. 1A
FIG. 1B
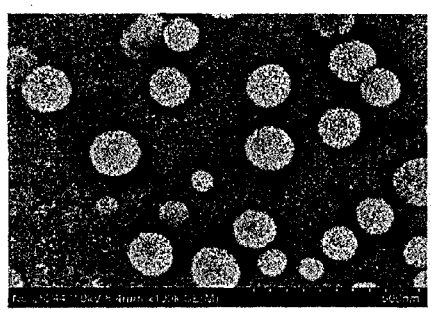
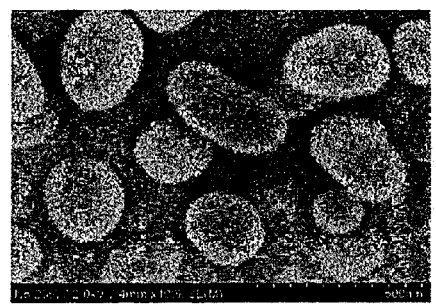
FIG. 2
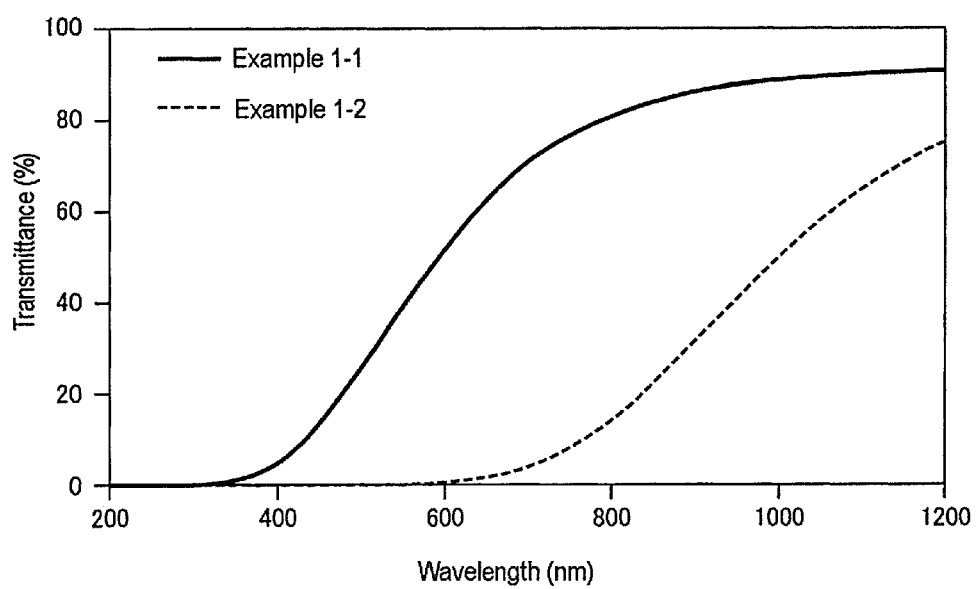

FIG. 12

FIG. 13
| | Crystallized glass (with IOX) | Phase-separated glass (with IOX) | Reference glass (with IOX) |
|---|---|---|---|
| Molten salt | $KNO_3$ (100%) | $KNO_3$ (100%) | $KNO_3$ (100%) |
| Ion exchange | 450°C, 30 hours | 450°C, 6 hours | 425°C, 6 hours |
| CS | - | 695 MPa | 1018 MPa |
| DOL | (~5 μm) (Ion profile by SEM-EDX) | 21 μm | 27 μm |
| Photos and schematic views | | | |
FIG. 14A
Crystallized glass (with IOX)
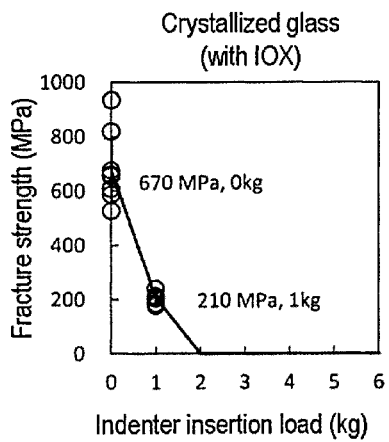
FIG. 14B
Phase-separated glass (with IOX)
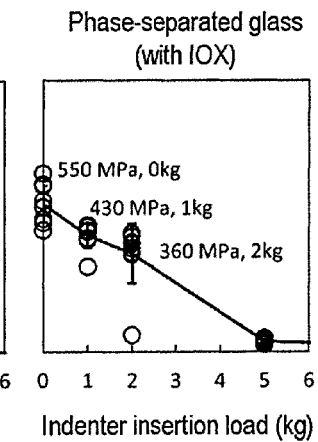
FIG. 14C
Reference glass (with IOX)
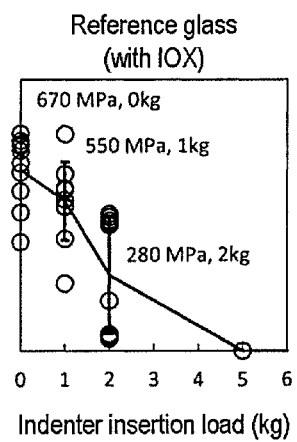

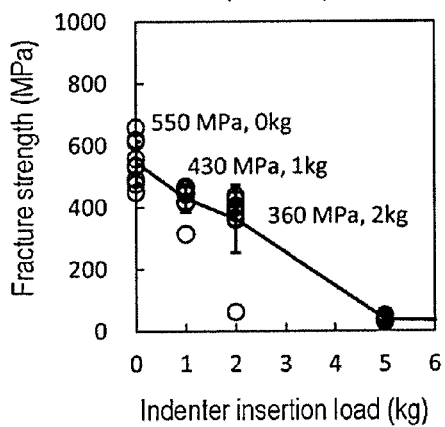
FIG. 15A
Phase-separated glass (with IOX)
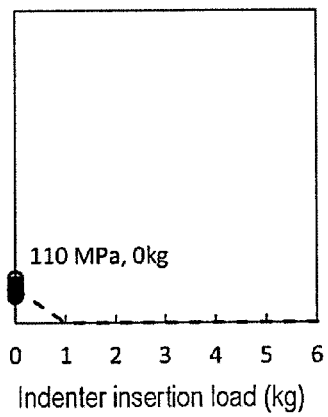
FIG. 15B
Phase-separated glass (without IOX)
FIG. 16A
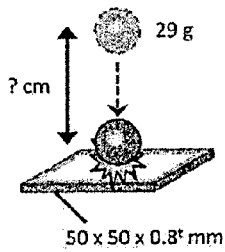
FIG. 16B
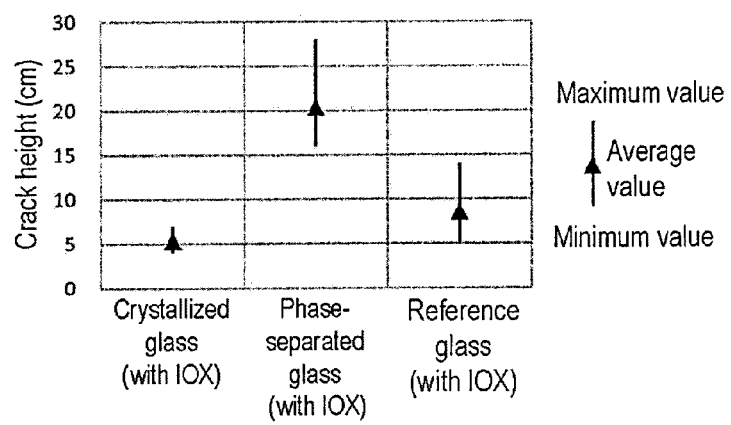
FIG. 16C
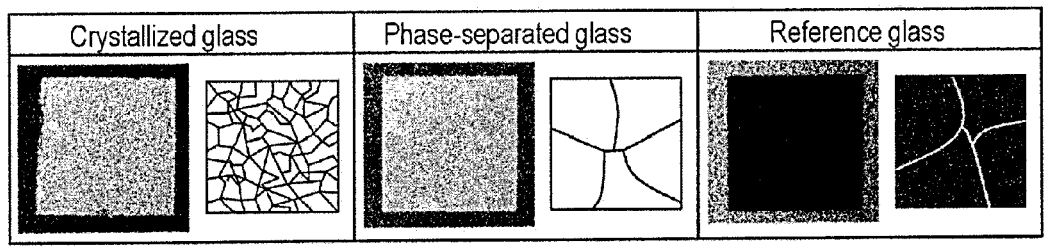

A: Crystallized glass
B: Phase-separated glass
C: Reference glass

PROCESS FOR PRODUCING CHEMICALLY STRENGTHENED GLASS

TECHNICAL FIELD

The present invention relates to a process for producing chemically strengthened glass to be favorably used as an exterior member of electronic device such as communication device or information device which can be used by being carried.

BACKGROUND ART

In a housing of electronic device such as a mobile phone, a method appropriately selected from materials of resins or metals is used in consideration of various factors such as decoration properties, scratch resistance, workability, and cost. In recent years, glass which has not been used in the related art has been attempted to be used as a material of a housing (Patent Document 1). According to Patent Document 1, in the electronic device such as a mobile phone, it is possible to exhibit a distinctive decorative effect with a transparency feeling by forming a main body of the housing with glass.

Electronic device includes a display device such as a liquid crystal panel on the outer surface of the device. Such a display device tends to have high definition and high luminance, and a backlight serving as a light source tends to have high luminance in accordance with the tendency. Light from the light source is radiated to the display device side and reaches the rear surface of the housing externally mounted through multiple reflections in the inside of the device in some cases.

In addition, even in a case of an organic EL (Electro-Luminescence) display which does not need a light source, similarly, leakage of light from a light emitting element is concerned. When a metal is used as a material of a housing, such a problem is not caused. However, when glass having transparency as described above is used there may be the case where light from the light source is transmitted through the housing and then recognized from the outside of the device. Accordingly, when glass is used for the housing, light shielding means such as a coating film for allowing glass to have a shielding property with respect to visible light (hereinafter, referred to as a shielding property) is formed on the rear surface of the glass.

As described above, in accordance with high luminance of the light source in the display device, it is necessary to form a thick film or a film formed of a plurality of layers as a coating film in order to form the coating film with a sufficient shielding property on the rear surface (device side) of glass, and this results in increasing the number of steps and the cost.

Further, in a case where the coating film is not uniformly formed, there is a concern that light is transmitted through only a portion whose coating film is thin and the appearance of the device may be impaired, for example, such that the housing is recognized to be locally bright. For example, in a concave housing, it is necessary to form a uniform film on the entire surface on a concave surface side. However, a step of uniformly forming a coating film having a sufficient shielding property on a concave surface is complicated and this results in increasing the cost.

Particularly, in a case where a housing whose appearance exhibits white is obtained, a method of forming a white coating film layer on at least one surface of transparent glass as described above may be used. However, since a white coating material has high translucency, a sufficient shielding property cannot be obtained even when the white coating film layer is made thick.

Consequently, a black coating film layer having a high shielding property is laminated on a white coating film layer, but it is necessary to make the white coating film layer thick to the extent that the black coating film layer is not recognized. In this manner, when a housing having a high shielding property, which exhibits white using a white coating material, is obtained, there is a problem that the cost thereof is extremely high.

Further, in electronic device which can be used for a mobile phone or the like, a housing is needed to have high strength in consideration of fracture due to impact from a fall during use and contact scratch due to use over a long period of time. Accordingly, in the related art, in order to improve scratch resistance of glass or a glass substrate, the glass is chemically strengthened to form a compressive stress layer on the surface thereof so that the scratch resistance is improved.

CITATION LIST

Patent Document

Patent Document 1: JP-A-2009-61730

SUMMARY OF INVENTION

Technical Problem

As a method of obtaining a shielding property, the use of crystallized glass can be conceived, but the ion exchanging temperature is necessary to be high in general and there is a concern that problems such as evaporation or the like of molten salts may happen in a case where the crystallized glass is subjected to an ion exchange treatment.

Accordingly, an object of the present invention is to provide a process for producing chemically strengthened glass which has a shielding property suitable for a housing of electronic device and is highly strengthened by being subjected to an ion exchange treatment at a low ion exchanging temperature.

Solution to Problem

1. A process for producing a chemically strengthened glass, comprising subjecting a phase-separated glass to an ion exchange treatment.

2. A process for producing a chemically strengthened glass, comprising phase-separating a glass, and subsequently subjecting the glass which has been phase-separated to an ion exchange treatment.

3. The process for producing a chemically strengthened glass according to the above 1 or 2, wherein the phase-separated glass contains $Na_2O$ or $Li_2O$ or both of them.

4. The process for producing a chemically strengthened glass according to any one of the above 1 to 3, wherein the phase-separated glass contains $SiO_2$, $Al_2O_3$ and MgO.

5. The process for producing a chemically strengthened glass according to the above 3 or 4, wherein the phase-separated glass contains at least one selected from the group consisting of $TiO_2$, $ZrO_2$, $P_2O_5$ and $La_2O_3$.

6. The process for producing a chemically strengthened glass according to any one of the above 1 to 5, wherein the phase-separated glass contains $K_2O$.

7. The process for producing a chemically strengthened glass according to any one of the above 1 to 6, wherein the phase-separated glass is a glass in a binodal state in which a dispersed phase of a silica-rich component is contained in an alkali-rich matrix.

8. The process for producing a chemically strengthened glass according to any one of the above 1 to 7, wherein the glass contains, as represented by mol % based on oxides, 50% to 80% of $SiO_2$, 5% to 30% of MgO, 1% to 17% of $Na_2O$, 0% to 10% of $P_2O_5$, 0% to 10% of $Al_2O_3$, 0% to 6% of $B_2O_3$ and 0% to 9% of $K_2O$.

Here, for example, the expression "containing 0% to 10% of $P_2O_5$" means that $P_2O_5$ is not essential but may be contained in an amount of 10% or less. Further, $SiO_2$ is typically contained in an amount of 60% to 80%, and the glass may contain components other than these seven components ($SiO_2$, MgO, $Na_2O$, $P_2O_5$, $Al_2O_3$, $B_2O_3$, and $K_2O$) in a level not damaging an object of the present invention, but the total content of the components is preferably 10% or less and typically 5% or less in that case.

In the present specification, the content of a glass component is represented by mol %.

9. A chemically strengthened glass which is obtained by the process for producing a chemically strengthened glass as described in the above 1 to 8.

10. A phase-separated glass which has been subjected to an ion exchange treatment.

11. A phase-separated glass comprising a compressive stress layer in a surface thereof.

As this phase-separated glass, typical examples thereof include the phase-separated glass according to the above 10.

12. A phase-separated glass, wherein, in a three-point bending strength test, a value obtained by dividing a value obtained by subtracting a three-point bending strength in 2 kg of Vickers indenter insertion load from a three-point bending strength in 0 kg of Vickers indenter insertion load by the three-point bending strength in 0 kg of Vickers indenter insertion load is 70% or less.

As this phase-separated glass, typical examples thereof include the phase-separated glass according to the above 10 or 11.

13. A phase-separated glass which is not fractured when a Vickers indenter is inserted with a load of 19.6 N.

As this phase-separated glass, typical examples thereof include the phase-separated glass according to the above 10, 11 or 12.

14. A phase-separated glass, wherein an average falling ball height at a time of fracture is 8 cm or more in a sandpaper falling ball test in which a spherical object which is made of 29 g of stainless steel and has a diameter of 0.75 inch, i.e. 19.1 mm, is dropped from an upper side in a state where the phase-separated glass is placed on a base made of granite and an upper surface of the phase-separated glass is brought into contact with an abrasive surface of a sandpaper of P30 (JIS R6252: 2006).

As this phase-separated glass, typical examples thereof include the phase-separated glass according to any one of the above 10 to 13.

15. The phase-separated glass according to the above 11, which has a surface compressive stress of 300 MPa or more and a tensile stress of 50 MPa or less.

16. The phase-separated glass according to any one of the above 10 to 15,
wherein a linear transmittance at a wavelength of 400 nm is 30% or less in terms of a thickness of 1 mm, and
a total light reflectance at the same wavelength is 10% or more in terms of a thickness of 1 mm.

17. The phase-separated glass according to any one of the above 10 to 16, which is in a binodal state which has a shape in which one separated phase in a form of an independent spherical shape is dispersed in a matrix of another separated phase.

18. The phase-separated glass according to claim 17, wherein an average diameter of the separated phase which is dispersed in a form of an independent spherical shape is 40 nm to 3000 nm.

19. An electronic device housing, comprising the chemically strengthened glass according to the above 9 or the phase-separated glass according to any one of the above 10 to 18.

20. The electronic device housing according to claim 19, wherein the phase-separated glass has a linear transmittance at a wavelength of 400 nm of 30% or less and a total light reflectance at a wavelength of 400 nm of 10% or more.

Advantageous Effects of Invention

According to the process for producing a chemically strengthened glass in the present invention, it is possible to obtain a chemically strengthened glass which has an excellent shielding property suitable for a housing of electronic device and is highly strengthened without separately providing light shielding means such as a light shielding film on the glass at a low cost.

When a housing whose outer appearance exhibits white is intended to be obtained using transparent glass, a plurality of white coating film layers are necessary to be laminated as described above. However, according to the present invention, the white coating film layers is not necessary to be laminated, because glass itself exhibits milky white, or an effect of exceedingly reducing the number of layers compared to the case of the transparent glass can be obtained even when the white coating film layers are laminated.

Further, according to the chemically strengthened glass obtained by the production process of the present invention and phase-separated glass of the present invention, it is possible to obtain an effect of obtaining excellent scratch resistance compared to crystallized glass which has been chemically strengthened by being subjected to an ion exchange treatment.

According to the production process of the present invention, it is possible to produce whitened chemically strengthened glass in which a deep compressive stress layer is formed in a short time and resistance to scratch is improved, as compared to crystallized glass, by allowing glass to exhibit white through phase-separation of the glass and by allowing the glass to be chemically strengthened with the ion exchange treatment at a low temperature.

BRIEF DESCRIPTION OF DRAWINGS

FIGS. 1A-1B are views illustrating results of phase-separated glass observed by an SEM (magnification: 100000 times).

FIG. 2 is a diagram illustrating measurement results of transmittance of the phase-separated glass.

FIG. 10A is a diagram illustrating the fracture origin and FIG. 10B is a diagram illustrating cracks.

FIG. 12 shows photos after insertion of indenters to crystallized glass, phase-separated glass (binodal), reference glass, and phase-separated glass (spinodal), each of which has been subjected to an ion exchange treatment.

FIG. 13 shows photos and schematic views of glass fractured in the three-point bending strength test and results of measurement of surface compressive stress (CS) values and compressive stress layer depths (DOL) of crystallized glass, phase-separated glass, and reference glass, each of which has been subjected to the ion exchange treatment. Further, the DOL of the crystallized glass is acquired by a K ion profile based on SEM-EDX.

In FIGS. 14A-14C, FIGS. 14A-14C are diagrams illustrating results of insertion of a Vickers indenter and performing a destructive three-point bending strength test. In FIGS. 14A-14C. FIG. 14A illustrates results of crystallized glass which has been subjected to the ion exchange treatment, FIG. 14B illustrates results of phase-separated glass which has been subjected to the ion exchange treatment, and FIG. 14C illustrates results of reference glass which has been subjected to the ion exchange treatment.

In FIGS. 15A-15B, FIGS. 15A-15B are diagrams illustrating results of insertion of a Vickers indenter and performing a destructive three-point bending strength test. In FIGS. 15A-15B, FIG. 15A illustrates results of phase-separated glass which has been subjected to the ion exchange treatment, and FIG. 15B illustrates results of phase-separated glass which has not been subjected to the ion exchange treatment.

FIG. 16A is a diagram illustrating a method of testing a sandpaper falling ball test. FIG. 16B is a diagram illustrating results of a sandpaper falling ball test. FIG. 16C shows photos and schematic views of glass after the sandpaper falling ball test is performed in regard to crystallized glass which has been subjected to the ion exchange treatment, phase-separated glass which has been subjected to the ion exchange treatment, and reference glass which has been subjected to the ion exchange treatment.

DESCRIPTION OF EMBODIMENTS

Figure 3:
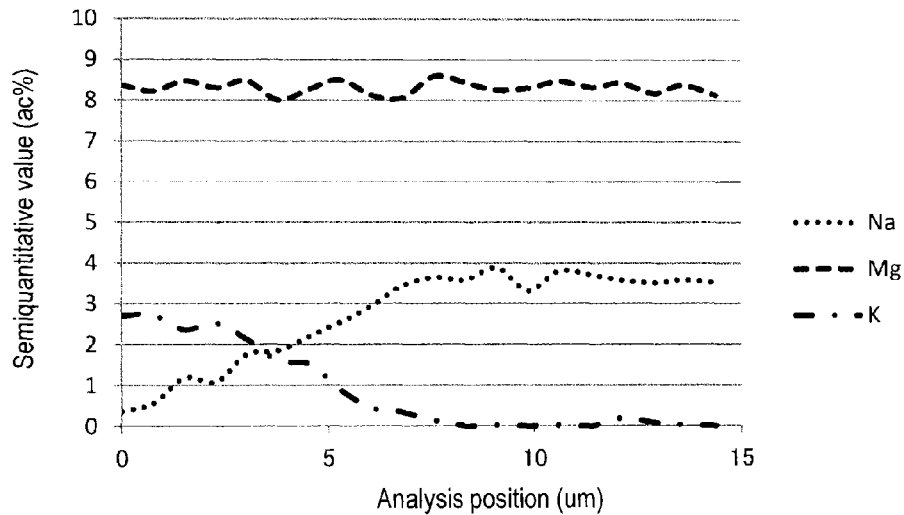
FIG. 3 is a diagram illustrating results of SEM-EDX point analysis of a sample cross-section after a chemical strengthening treatment is performed.

Hereinafter, a process for producing a chemically strengthened glass of the present invention will be described with reference to preferred embodiments.

The present invention relates to a process for producing a chemically strengthened glass, which includes a step of subjecting a phase-separated glass to an ion exchange treatment. The process for producing glass is not particularly limited. For example, various raw materials are blended in an appropriate amount, followed by heating and melting in a temperature range of approximately 1500° C. to 1800° C., and then, they are homogenized by defoaming, stirring and the like, molded into a sheet shape by a known method such as a float method, a down draw method, a press method, or a roll-out method, or into a block shape through casting, annealed, processed into an arbitrary shape, subjected to a treatment of phase-separation, processed into a desired shape, and then, subjected to the ion exchange treatment.

As examples of raw materials to be used in the present invention, oxides, composite oxides, carbonates, hydroxides, and hydrates thereof can be appropriately used. Examples of the oxides include silica sand (silicon dioxide), magnesium oxide, aluminum oxide, lanthanum oxide ($La_2O_3$), zirconia ($ZrO_2$), titanium oxide ($TiO_2$), and boron oxide ($B_2O_3$).

Examples of the composite oxides include dolomite [$CaMg(CO_3)_2$], zircon ($ZrSiO_4$), borax [$Na_2B_4O_5(OH)_4 \cdot 8H_2O$], and sodium metaphosphate ($NaPO_3$).

Examples of carbonates include sodium carbonate, soda ash, and potassium carbonate. Examples of hydroxides includes magnesium hydroxide and aluminum hydroxide. Examples of hydrates include boric acid ($H_3BO_3$) and phosphoric acid ($H_3PO_4$).

Examples of the raw materials include natural raw materials, purified raw materials, and grain size adjustment raw materials. In addition, examples of materials of adjusting an oxidation-reduction state (redox) of glass include materials containing organic or inorganic carbon such as coke or sucrose, materials containing hydrogen such as ammonium chloride, and raw materials which generate oxygen during dissolution of $SnO_2$ and the like.

Each raw material having an appropriate grain size can be appropriately used. By performing adjustment of the generated gas during dissolution of them, the water content in glass, the oxidation-reduction state, and the dissolution rate of each raw material by the raw material grain size, it is possible to improve the quality such as residual foam, foreign matter, aggregates or matrix homogeneity, and to appropriately use for minute adjustment of colors.

Further, in the present invention, glass which has been phase-separated by a heat treatment for melting, homogenizing, molding, annealed, or shaping without performing a particular treatment of phase-separation in a step of melting, homogenizing, molding, annealing, or shaping of glass is assumed to be included in phase-separated glass and the step of phase-separating the glass in this case is assumed to be included in steps such as melting and the like. Further, glass undergone a phase-separating step of phase-separating glass before a molding step of molding glass is assumed to be included in phase-separated glass.

(1) Phase-Separation of Glass

Phase-separation of glass means that a single phase of glass is separated into two or more glass phases. As a method of phase-separating glass, a method of heat-treating glass may be exemplified.

As the condition of the heat treatment for phase-separation of glass, typically, a temperature which is higher than the glass transition point by 50° C. to 400° C. is preferable. A temperature higher than the glass transition point by 100° C. to 300° C. is more preferable. The time for performing the heat treatment of glass is preferably in the range of 1 hour to 64 hours and more preferably 2 hours to 32 hours. From a viewpoint of mass productivity, the time therefor is preferably 24 hours or less and more preferably 12 hours or less. In the phase-separating step of phase-separating glass, it is preferable to hold the glass at a temperature equal to or lower than the phase-separation initiation temperature and higher than 1200° C. prior to the molding step of molding glass.

It is possible to determine whether the glass is phase-separated or not by using a scanning electron microscope (SEM). In a case where the glass is phase-separated, when the glass is observed by the SEM, the phase of the glass being separated into two or more phases can be observed.

(First Embodiment of Glass Composition)

The glass composition described below is the glass composition (first embodiment of glass composition) prepared for mainly exemplifying the binodal, but it goes without saying that the composition for exemplifying the binodal is not limited thereto. Further, in regard to the composition range of the first embodiment of the glass composition, it goes without saying that the binodal may become the spinodal by the composition or the heat treatment temperature. The present invention includes both phase-separation forms of the binodal and the spinodal.

It is preferable that the phase-separated glass contains $Na_2O$ or $Li_2O$ or both of them. In a case where the phase-separated glass contains $Na_2O$ or $Li_2O$ or both of them, it is possible to increase the strength of the glass due to the subsequent ion exchanging treatment. The content of $Na_2O$ in the glass is preferably 1% or more. By adjusting the content thereof to be 1% or more, a desired surface compressive stress layer can be easily formed by the ion exchange treatment. The content thereof is preferably 3% or more and more preferably 4% or more. When the content of $Na_2O$ is more than 17%, weather resistance is decreased. The content thereof is preferably 14% or less and more preferably 11% or less.

The content of $Li_2O$ in the glass is preferably 1% or more. By adjusting the content thereof to be 1% or more, a desired surface compressive stress layer can be easily formed by the ion exchange treatment. The content thereof is preferably 2% or more and more preferably 4% or more. When the content of $Li_2O$ is more than 17%, weather resistance is decreased. The content thereof is preferably 14% or less and more preferably 13% or less.

In a case where both of $Na_2O$ and $Li_2O$ are contained in the glass, the total content of $Na_2O$ and $Li_2O$ is preferably 2% or more. By adjusting the content thereof to be 2% or more, a desired surface compressive stress layer can be easily formed by the ion exchange treatment. The content thereof is preferably 3% or more and more preferably 4% or more. When the total content of $Na_2O$ and $Li_2O$ is more than 17%, weather resistance is decreased. The content thereof is preferably 14% or less and more preferably 13% or less.

It is preferable that the phase-separated glass contains $SiO_2$, $Al_2O_3$, and MgO. In a case where the phase-separated glass contains $SiO_2$, $Al_2O_3$, and MgO, the ion exchange treatment can be easily performed and durability and strength are improved. The content of $SiO_2$ in the phase-separated glass is preferably in the range of 50% to 80%, more preferably in the range of 55% to 75%, and still more preferably in the range of 60% to 70%.

The content of $Al_2O_3$ in the phase-separated glass is preferably in the range of 0% to 10%, more preferably in the range of 1% to 7%, and still more preferably in the range of 2% to 6%. The expression of "the content of $Al_2O_3$ is preferably in the range of 0% to 10%" means that $Al_2O_3$ may or may not be contained, but the content thereof is preferably 10% or less in the case where $Al_2O_3$ is contained.

The content of MgO in the phase-separated glass is preferably in the range of 5% to 30%, more preferably in the range of 10% to 25%, and still more preferably in the range of 12% to 20%. The content of $B_2O_5$ in the phase-separated glass is preferably in the range of 0% to 6%, more preferably in the range of 0.5% to 5%, and still more preferably in the range of 1% to 4%.

It is preferable that the phase-separated glass contain at least one selected from $ZrO_2$, $P_2O_5$, and $La_2O_3$. In a case where the phase-separated glass contains at least one selected from $ZrO_2$, $P_2O_5$, and $La_2O_3$, the whiteness of the glass can be increased. The total content thereof is preferably in the range of 0.5% to 10%.

The content of $ZrO_2$ in the phase-separated glass is preferably in the range of 0% to 5% and more preferably in the range of 0.5% to 3%. The content of $P_2O_5$ in the phase-separated glass is preferably in the range of 0% to 10%, more preferably in the range of 0.5% to 8%, still more preferably in the range of 1% to 6%, and most preferably in the range of 2% to 5%. The content of $La_2O_3$ in the phase-separated glass is preferably in the range of 0% to 2% and more preferably in the range of 0.2% to 1%.

The phase-separated glass may contain $K_2O$. $K_2O$ is a component for improving meltability and increasing the ion exchange rate during chemical strengthening to obtain a desired surface compressive stress and depth of a stress layer.

In order to improve meltability, when the content thereof is less than 1%, the effect is small. The content thereof is preferably 1% or more. Further, in order to improve the ion exchange rate, the content thereof is preferably 2% or more and typically 3% or more. When the content of $K_2O$ is more than 9%, the weather resistance is decreased. The content thereof is preferably 7% or less and typically 6% or less.

(Second Embodiment of Glass Composition)

The glass composition described below is the glass composition (second embodiment of glass composition) prepared for mainly exemplifying the spinodal, but it goes without saying that the composition for exemplifying the spinodal is not limited thereto. Further, in regard to the composition range of the second embodiment of the glass composition, it goes without saying that the spinodal may become the binodal by the composition or the heat treatment temperature. The present invention includes both phase-separation forms of the binodal and the spinodal.

It is preferable that the phase-separated glass contain $Na_2O$ or $Li_2O$ or both of them. In a case where the phase-separated glass contains $Na_2O$ or $Li_2O$ or both of them, the strength of the glass can be increased by the subsequent ion exchange treatment.

The content of $Na_2O$ in the glass is preferably 4% or more. By adjusting the content thereof to be 4% or more, a desired surface compressive stress layer can be easily formed by the ion exchange treatment. The content thereof is preferably 6% or more, more preferably 8% or more, and still more preferably 10% or more. When the content of $Na_2O$ is more than 20%, weather resistance is decreased.

The content thereof is preferably 20% or less, more preferably 18% or less, still more preferably 16% or less, and still more preferably 14% or less.

In a case of containing both of $Na_2O$ and $Li_2O$, the content of $Li_2O$ is preferably 2% or less. By adjusting the content thereof to be 2% or less, it is possible to prevent the glass transition point from being decreased, prevent the temperature of molten salts for ion-exchanging from being relatively increased, and prevent the surface compressive stress from not entering. The content thereof is preferably 1% or less and more preferably substantially zero.

It is preferable that the phase-separated glass contains $SiO_2$ and CaO. In a case where the phase-separated glass contains $SiO_2$ and CaO, durability and strength are improved. The content of $SiO_2$ is preferably in the range of 74% to 94%, more preferably in the range of 78% to 90%, still more preferably in the range of 80% to 88%, and still more preferably in the range of 82% to 86%. The content of CaO is preferably in the range of 0% to 10%, more preferably in the range of 1% to 8%, still more preferably in the range of 2% to 7%, and still more preferably in the range of 3% to 6%.

The content of MgO in the phase-separated glass is preferably in the range of 0% to 4%. MgO has substantially the same action as that of CaO. The content of MgO is more preferably in the range of 0% to 2%, still more preferably in the range of 0% to 1%, and still more preferably substantially zero.

The total content of MgO and CaO in the phase-separated glass is preferably in the range of 1% to 10%, more preferably in the range of 2% to 8%, still more preferably in the range of 2% to 7%, and still more preferably in the range of 3% to 6%.

The phase-separated glass may contain $K_2O$. $K_2O$ is a component for improving meltability and can increase the ion exchanging rate during chemical strengthening to obtain a desired surface compressive stress and depth of a stress layer. The content of MgO is more preferably in the range of 0% to 2%, still more preferably in the range of 0% to 1%, and still more preferably substantially zero.

The phase-separated glass may contain $Al_2O_3$. $Al_2O_3$ is a component for stabilizing glass and can improve weather resistance. The content of $Al_2O_3$ is preferably in the range of 0% to 2%, more preferably in the range of 0% to 1%, and still more preferably substantially zero.

The phase-separated glass may contain $B_2O_3$. $B_2O_3$ is a component for stabilizing glass and can improve devitrification resistance characteristics. The content of $B_2O_3$ is preferably in the range of 0% to 2%, more preferably in the range of 0% to 1%, and still more preferably substantially zero.

The entire description in the paragraphs below is common in the first and second embodiments of the glass composition.

As a clarifying agent during melting the glass, $SO_3$, chlorides or florides, $SnO_2$, $CeO_2$, $Sb_2O_3$, or $As_2O_3$ may be appropriately used. The addition amount of the clarifying agent is represented by mole percentage (external ratio) corresponding to 100 mol % which is the total amount of the glass main component. The typical addition amount of $SO_3$ is preferably in the range of 0.01% to 1.5%, more preferably in the range of 0.05% to 1%, and still more preferably in the range of 0.1% to 0.8% in terms of mole percentage. The typical residual amount of $SO_3$ is in the range of 0.01% to 0.5%.

The typical addition amount of Cl is in the range of 0.01% to 2%, preferably in the range of 0.05% to 1.6%, and more preferably in the range of 0.1% to 1.4%. The typical residual amount of Cl is in the range of 0.01% to 1.0%. The typical addition amount of F is in the range of 0.01% to 3%, preferably in the range of 0.05% to 2.4%, and more preferably in the range of 0.1% to 2.1%. The typical residual amount of F is in the range of 0.01% to 1.5%.

The typical addition amount or residual amount of $SnO_2$ is in the range of 0.01% to 1%, preferably in the range of 0.05% to 0.8%, and more preferably in the range of 0.1% to 0.7%. The typical addition amount or residual amount of $CeO_2$ is in the range of 0.01% to 1%, preferably in the range of 0.05% to 0.8%, and more preferably in the range of 0.1% to 0.7%. The typical addition amount or residual amount of $Sb_2O_3$ is in the range of 0.01% to 1%, preferably in the range of 0.05% to 0.8%, and more preferably in the range of 0.1% to 0.7%.

The typical addition amount or residual amount of $As_2O_3$ is in the range of 0.01% to 3%, preferably in the range of 0.05% to 2%, and more preferably in the range of 0.1% to 1%. The typical addition amount or residual amount of $Sb_2O_3$ is in the range of 0.01% to 3%, preferably in the range of 0.05% to 2%, and more preferably in the range of 0.1% to 1%. When adverse effects on the environment are taken into consideration, $As_2O_3$ is preferably not used. It is more preferable that $Sb_2O_3$ not be used together with $As_2O_3$.

As the state of the phase-separated glass, the binodal state and the spinodal state may be exemplified. The binodal state means phase-separation by a nucleation-growth mechanism, and generally has a spherical shape. Specifically, the binodal state is a state in a mode in which one separated phase in a form of an independent spherical shape is dispersed in a matrix of another separated phase. Further, the spinodal state is a state in which phase separation is mutually and continuously entangled in three dimensions with regularity to a certain degree.

In order to improve the surface compressive stress in the chemically strengthened layer having the surface compressive stress by subjecting the phase-separated glass to an ion exchange treatment, the phase-separated glass provided for the ion exchange treatment is preferably in the binodal state. Particularly, it is preferable that a dispersed phase of another silica-rich component be present in an alkali-rich matrix.

In addition, the dispersed phase of another component may be present in a silica-rich matrix. In this case, the phase-separated glass in the spinodal state is not actively excluded. Further, in the present invention, as the glass composition of the spinodal state, $SiO_2$—RO—$R'_2O$-based glass (R=MgO, CaO, SrO, or BaO, R'=Na, K, or Li) is exemplified, but $SiO_2$—$B_2O_3$—$R'_2O$-based glass (R'=Na, K, or Li) is not actively excluded.

It is preferable that the phase-separated glass be whitened. In regard to the transmittance of the phase-separated glass, transmittance T400 of glass having a thickness of 1 mm with respect to light having a wavelength of 400 nm is typically 70% or less, preferably 30% or less, more preferably 20% or less, still more preferably 10% or less, still more preferably 5% or less, particularly preferably 3% or less, and most preferably 1% or less. By adjusting the transmittance T400 of glass having a thickness of 1 mm with respect to light having a wavelength of 400 nm to be 30% or less, the phase-separated glass can be sufficiently whitened.

Further, in the phase-separated glass for chemical strengthening in the present invention, the total light reflectance with respect to light having a wavelength of 400 nm in terms of a thickness of 1 mm is preferably 10% or more, more preferably 30% or more, still more preferably 50% or more, and particularly preferably 70% or more. By adjusting the total light reflectance to be 10% or more, the phase-separated glass can be whitened.

In order to allow the phase-separated glass to have a light shielding property, all of transmittance T800 of glass having a thickness of 1 mm with respect to light having a wavelength of 800 nm, transmittance T600 of glass having a thickness of 1 mm with respect to light having a wavelength of 600 nm, and the transmittance T400 of glass having a thickness of 1 mm with respect to light having a wavelength 400 nm are preferably 30% or less, more preferably 10% or less, still more preferably 5% or less, and most preferably 1% or less. The transmittance of the phase-separated glass can be measured by general transmittance measurement (linear transmittance measurement). In addition, the transmittances T800, T600, and T400 of so-called transparent glass with respect to light having wavelengths of 800 nm, 600 nm, and 400 nm are all typically 80% or more in terms of a thickness 1 mm.

In order for the phase-separated glass to be whitened, the average size of a single phase in the phase-separation state or the average particle size of a dispersed phase in the phase-separated glass is preferably in the range of 40 nm to 3000 nm, more preferably in the range of 50 nm to 2000 nm, and still more preferably in the range of 100 nm to 1000 nm. The average size thereof or the average particle size thereof is typically 200 nm or more and 500 nm or less.

The average particle size of the dispersed phase can be measured by SEM observation. The average size of a single phase in the phase-separation state is an average value of widths of phases which are mutually and continuously entangled in the case of the spinodal state, and in the case of the binodal state, is an average value of diameters thereof in a case where one phase has a spherical shape or an average value between the major axis and the minor axis in a case where one phase has an oval spherical shape. Further, the average particle size of the dispersed phase is the above-described average size in a case of the binodal state.

In addition, in order for the phase-separated glass to be whitened, it is preferable that the refractive index difference between particles of the dispersed phase and the matrix surrounding the particles in the phase-separated glass be large.

Moreover, the volume ratio of particles of the dispersed phase in the phase-separated glass is preferably 5% or more, more preferably 10% or more, and still more preferably 20% or more. The volume ratio of particles of the dispersed phase is estimated from the ratio of the dispersed particles by calculating the ratio of dispersed particles distributed onto the glass surface from a SEM observation photo.

The separated phase is accompanied by crystallization in some cases. The crystallization may contribute to whitening. Accordingly, a composite phase of a separated phase and a crystalline phase is not particularly excluded. However, crystallization advanced to a level of decreasing the strength, increasing the ion exchanging temperature, or decreasing ion exchanging performance (compressive stress or the thickness of the stress layer) is not preferable. The ratio of the volume of particles of the crystalline phase to (the volume of particles of the dispersed phase and the volume of crystalline particles) is preferably 50% or less, more preferably 20% or less, still more preferably 10% or less, still more preferably 1% or less, and still more preferably 0%.

(2) Ion Exchange Treatment

In the production process of the present invention, the phase-separated glass is chemically strengthened through the ion exchange treatment to thereby have high strength. The chemical strengthening is a method of forming the compressive stress layer in the glass surface and increasing the strength of the glass. Specifically, the chemical strengthening is a treatment of exchanging alkali metal ions (typically, Li ions and Na ions) having a small ion radius of the surface of a glass sheet with alkali ions (typically, Na ions or K ions with respect to Li ions and K ions with respect to Na ions) having a larger ion radius through ion exchange at a temperature equal to or lower than the glass transition point.

The method of chemical strengthening is not particularly limited as long as $Li_2O$ or $Na_2O$ in the glass surface layer and $Na_2O$ or $K_2O$ in molten salts can be ion exchanged, and a method of immersing a glass in heated potassium nitrate ($KNO_3$) molten salts or the like may be exemplified.

Conditions for forming a chemically strengthened layer (surface compressive stress layer) having a desired surface compressive stress in the glass varies depending on the thickness of the glass, but the temperature thereof is preferably in the range of 350° C. to 550° C. and more preferably in the range of 400° C. to 500° C. In addition, the time for chemical strengthening is preferably in the range of 1 hour to 144 hours and more preferably 2 hours to 24 hours. Examples of the molten salts include $KNO_3$ and $NaNO_3$. Specifically, a glass is typically immersed in $KNO_3$ molten salts in the temperature range of 400° C. to 550° C. for 2 hours to 24 hours.

(3) Compressive Stress Layer

The chemically strengthened glass obtained by the production process of the present invention (hereinafter, referred to also as chemically strengthened glass of the present invention), phase-separated glass which has been subjected to the ion exchange treatment of the present invention, and phase-separated glass having a compressive stress layer in the surface of the present invention (hereinafter, referred to also as the phase-separated glass of the present invention) include a compressive stress layer in the surface by the ion exchange treatment. The surface compressive stress is preferably 300 MPa or more and more preferably 400 MPa or more. The surface compressive stress can be measured using birefringence as long as the surface compressive stress has light transparency. In the production of glass to be used for a housing, when the glass is flat, a polishing step is performed in some cases.

In the polishing step of the glass, the grain size of polishing abrasive grains to be used for polishing at the final stage thereof is typically in the range of 2 μm to 6 μm, and it is considered that a microcrack having a maximum diameter of 5 μm is finally formed on the glass surface due to the abrasive grains.

In order to achieve an effective effect of improving the strength by chemical strengthening, it is preferable that a surface compressive stress layer which is deeper than the microcrack formed on the glass surface be present and the depth of the surface compressive stress layer generated by chemical strengthening is preferably 6 μm or more. In addition, when a scratch having a depth which is deeper than that of the surface compressive stress layer is made during use, this leads to fracture of the glass, and accordingly, the surface compressive stress layer is preferably deep. The depth thereof is preferably 10 μm or more, more preferably 15 μm or more, still more preferably 20 μm or more, and typically 30 μm or more.

Meanwhile, in a case where the surface compressive stress layer becomes extremely deep, the inner tensile stress becomes large and the impact at the time of fracture becomes large. That is, it is found that the glass is fractured to small pieces at the time of fracture and tends to be shattered into pieces when the inner tensile stress is large. As a result of experiment conducted by the present inventors, it has been found that scattering at the time of fracture becomes significant when the depth of the surface compressive stress layer exceeds 70 μm in the glass having a thickness of 2 mm or less.

Therefore, in the chemically strengthened glass of the present invention, the depth of the surface compressive stress layer is preferably 70 μm or less. In a case where the chemically strengthened glass of the present invention is used as a housing, the usage thereof depends on the electronic device on which the glass is externally mounted, but it is considered that the depth of the surface compressive stress layer is set to be small in terms of safety in the use for a panel in which a contact scratch is made on the surface thereof with a high probability. The depth thereof is more preferably 60 μm or less, still more preferably 50 μm or less, and typically 40 μm or less.

In a case of ion-exchanging between sodium components in the glass surface layer and potassium components in molten salts in the ion exchange treatment, alkali ion concentration analysis in the depth direction of the glass is performed using an electron probe micro analyzer (EPMA) and potassium ion concentration analysis is performed in this case, and a potassium ion diffusion depth obtained by measurement is regarded as the depth of the surface compressive stress layer.

Moreover, in a case of ion-exchanging between lithium components in the glass surface layer and sodium components in molten salts in the ion exchange treatment, sodium ion concentration analysis in the depth direction of the glass is performed using an EPMA and the sodium ion diffusion depth obtained by measurement is regarded as the depth of the surface compressive stress layer.

The tensile stress of the chemically strengthened glass of the present invention is preferably 50 MPa or less, more preferably 45 MPa or less, still more preferably 40 MPa or less, and most preferably 30 MPa or less. Further, the tensile stress thereof is calculated by the expression of (value of surface compressive stress×depth of surface compressive stress layer)/(thickness of chemically strengthened glass−2× depth of compressive stress layer).

In addition, the depth of the surface compressive stress layer and the value of the surface compressive stress in the chemically strengthened glass of the present invention can be measured using an EPMA or a surface stress meter (for example, FSM-6000, manufactured by ORIHARA INDUSTRIAL CO., LTD.). The surface stress meter measures stress through interference of light propagating within the thickness of 100 μm of the surface layer. Accordingly, even when the layer is white, the stress can be measured as long as the light has transparency.

(4) Three-Point Bending Strength

In a three-point bending strength test, one embodiment of the present invention is phase-separated glass (hereinafter, referred to also as phase-separated glass of the present invention) in which a value obtained by diving a value obtained by subtracting a three-point bending strength in 2 kg of Vickers indenter insertion load from a three-point bending strength in 0 kg of Vickers indenter insertion load by the three-point bending strength in 0 kg of Vickers indenter insertion load is 70% or less. A decreasing rate of the three-point bending strength in 0 kg to 2 kg of indenter insertion load measured through the three-point bending strength test in which a Vickers indenter is inserted is 70% or less, preferably 60% or less, and more preferably 50% or less. In a case where the decreasing rate of the three-point bending strength in 0 kg to 2 kg of the indenter insertion load measured through the three-point bending strength test in which a Vickers indenter is inserted is 70% or less, high resistance to scratch can be obtained.

The three-point bending strength test is performed as follows under the conditions of a support base span having a size of 30 mm and a crosshead speed of 0.5 mm/min. A glass sheet which has dimensions of a thickness of 1 mm and a size of 5 mm×40 mm and whose both surfaces has been subjected to minor polishing using cerium oxide is chemically strengthened, and a Vickers indenter is put on the center of each glass sheet with a load of 1 kgf=9.8 N to 5 kgf=49 N using a Vickers hardness meter under the conditions of a temperature of 20° C. to 28° C. and a humidity of 40% to 60%, thereby forming indentation, and then bending strength (unit: MPa) thereof is measured.

In addition, another embodiment of the present invention is phase-separated glass (hereinafter, referred to also as phase-separated glass of the present invention) which is not cracked when the Vickers indenter is inserted with a load of 2 kgf. By using the phase-separated glass not being cracked when the Vickers indenter is inserted with a load of 2 kgf (19.6 N), resistance to scratch can be improved. A phase-separated glass which is not cracked when the Vickers indenter is inserted with a load of 5 kgf (49N) is preferable.

(5) Sandpaper Falling Ball Test

When impact is applied to cover glass or a housing in a case where a device which is carried and used by a user is dropped by mistake, a slow crack in which glass is cracked at a relatively slow speed may be generated from an origin of a scratch made through the compressive stress layer even in a case of using a chemically strengthened cover glass or housing (hereinafter, such a cracked manner of the glass is referred to as slow cracking). Further, slow cracking is a phenomenon in which the number of cracked pieces is generally small and, most typically, a single crack is extended from the origin of fracture, resulting in cracking of the cover glass into two pieces.

More specifically, determination whether cracking is slow cracking or not can be made as follows. First, when the origin of fracture is not recognized, this phenomenon can not be said to be slow cracking. Further, in a case where it is observed that a scratch made through the compressive stress layer, that is, a scratch which is made deeper than the depth of the compressive stress layer (so-called DOL) is the fracture origin by observing the vicinity of the fracture origin, the phenomenon is slow cracking. In addition, in a case where the radius of a mirror surface is long, a fractured cross section is the mirror surface, and mist or hackle is not recognized, the phenomenon is slow cracking.

Figure 6:
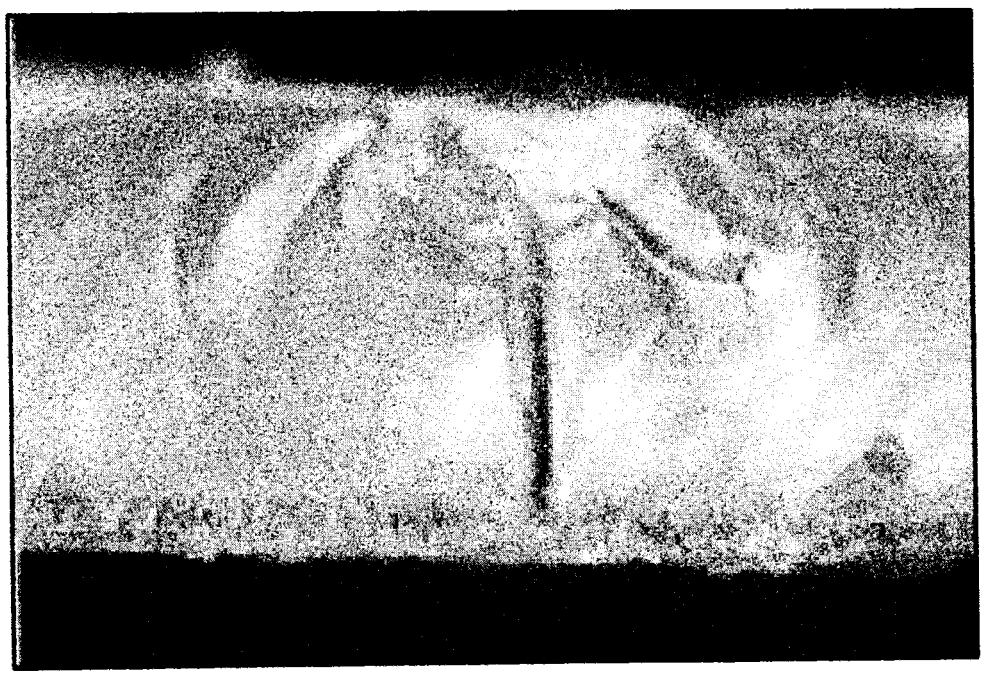
FIG. 6 is a view showing a photo of a fracture origin of cover glass in which non-slow cracking is generated when seen from a side.
Figure 7:
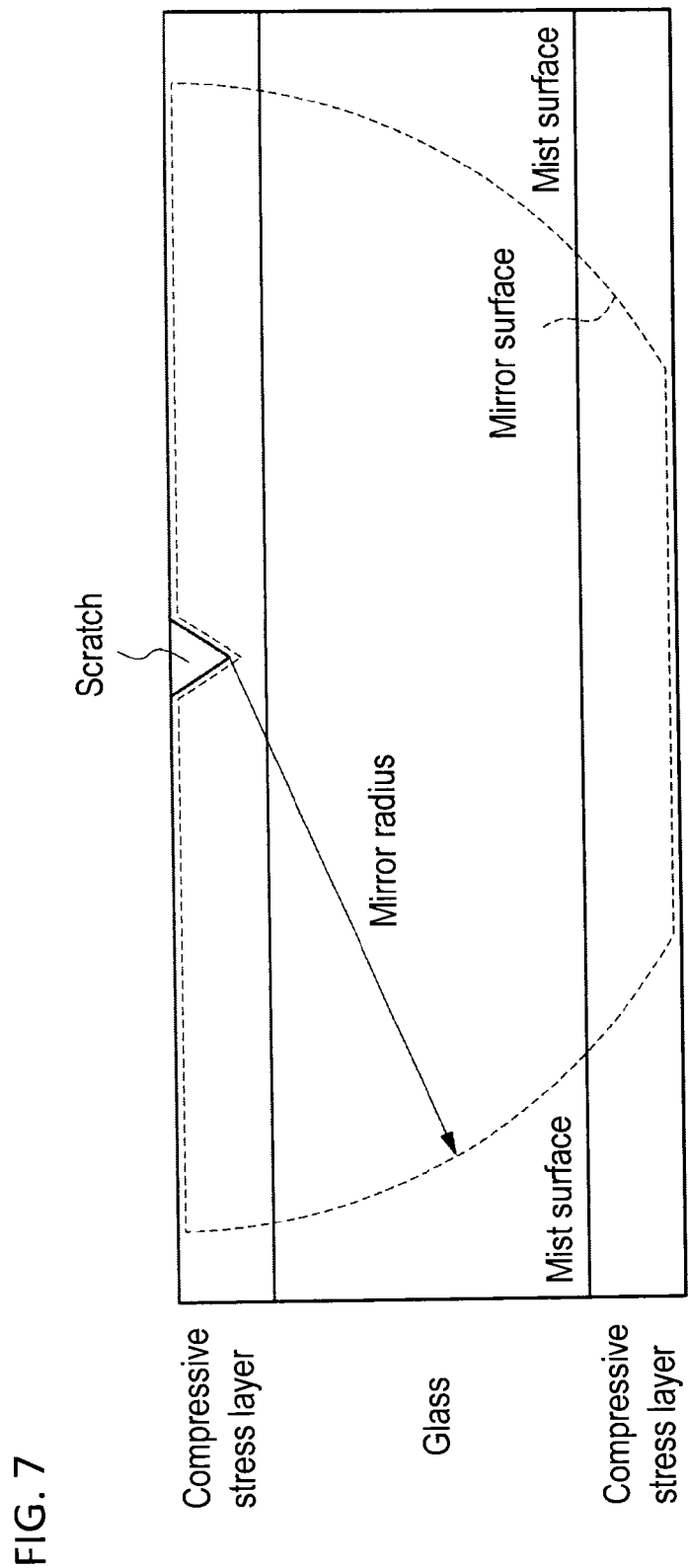
FIG. 7 is a diagram schematically illustrating the fracture surface in FIG. 6.

Next, for comparison with slow cracking, a cracked manner of cover glass which is not slow cracking will be described (hereinafter, referred to also as non-slow cracking). As the non-slow cracking, cracking of the cover glass which is generated by insertion of a knoop indenter into the glass surface will be described. FIG. 6 is a view showing a photo of a fracture origin of cover glass in which non-slow cracking is generated when seen from a side. FIG. 7 is a diagram schematically illustrating the fracture surface in FIG. 6.

When the fracture surface of the non-slow cracking is observed, the fracture origin is formed in the compressive stress layer, a mirror surface having the short mirror radius which is smooth such as a mirror is obtained in the surroundings thereof, and a mist surface is present in the surroundings of the mirror surface. According to fracture surface analysis of the non-slow cracking, the mirror surface having a short mirror radius means that the fracture caused by large stress is advanced and the mist surface means that the crack is rapidly grown.

Figure 8:
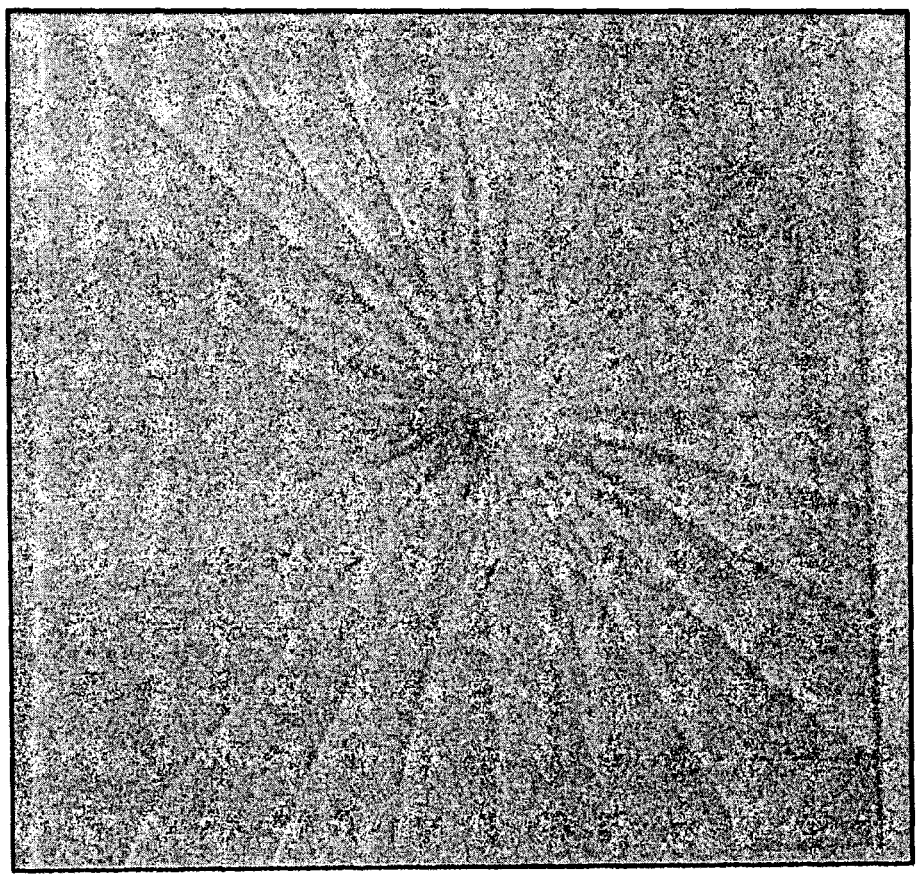
FIG. 8 is a view showing a photo of the cover glass in which spider cracking is generated.

Therefore, according to the fracture surface in FIG. 6, it is found that, in the cover glass, after a fracture origin which is shallower than the depth of the compressive stress layer is formed, fracture is advanced by large stress and cracks are rapidly grown. When non-slow cracking is generated, cover glass becomes a plurality (20 pieces or more) of glass pieces by a plurality of cracks extended in a form of a spider's web as illustrated in FIG. 8 (hereinafter, such a cracked manner is referred to as spider cracking). In this manner, in slow cracking and non-slow cracking, it is found that fracture is generated in modes which are completely different from each other.

In regard to the non-slow cracking, since the fracture origin is generated in the compressive stress layer, increasing of the surface compressive stress or increasing of the depth of the compressive stress layer is effective for preventing generation of the fracture origin in the compressive stress layer.

However, in regard to slow cracking, since the fracture origin is generated in the area outside the compressive stress layer, that is, in the area of a tensile stress layer (the depth of a scratch is typically tens of micrometers to hundreds of micrometers, and the compressive stress layer by chemical strengthening is several micrometers to tens of micrometers), it is necessary to select cover glass or glass for a housing having mechanical characteristics that are resistant to slow cracking in cover glass for a tablet PC with a function of a touch sensor or glass for a housing, in which slow cracking is easily generated.

As a method for reproducing slow cracking, a sandpaper falling ball test described below is employed by the present inventors. Further, it is possible to provide glass for a housing for a tablet PC with a function of a touch sensor which is thin and resistant to slow cracking by acquiring the threshold value from the sandpaper falling ball test, and by obtaining the glass for a housing having the value equal to or more than the threshold value.

Figure 9:
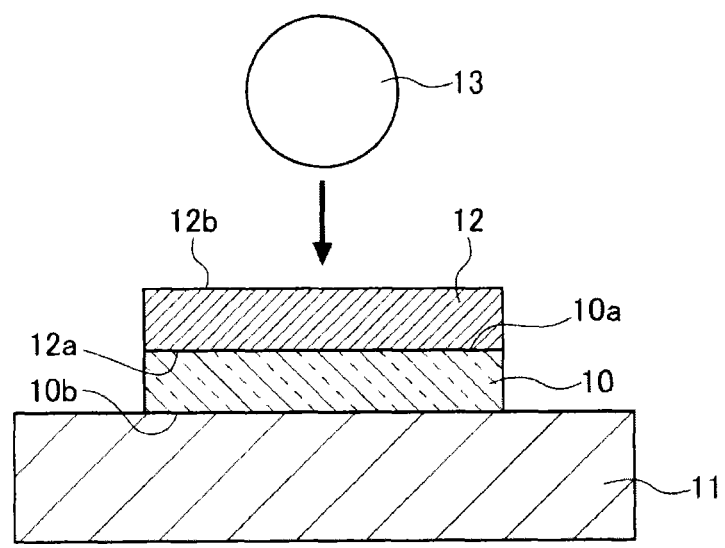
FIG. 9 is a diagram schematically illustrating a method of reproducing slow cracking.

As illustrated in FIG. 9, the sandpaper falling ball test is a test in which chemically strengthened glass 10 in which the compressive stress layer has been formed on the surface thereof is placed on a base 11, the chemically strengthened glass 10 is brought into contact with a abrasive surface 12a of sandpaper 12 including a polishing material having a size equal to or more than the depth of the compressive stress layer, and a spherical object 13 such as an iron ball is dropped from the upper side.

At this time, preferably, the sandpaper 12 is placed on the upper side of the chemically strengthened glass 10, an upper surface 10a of the chemically strengthened glass 10 is in contact with the abrasive surface 12a of the sandpaper 12, and a spherical object 13 is dropped onto a surface 12b on the opposite side to the abrasive surface 12a of the sandpaper 12.

As the base 11, a base formed of hard stone such as granite is preferable. In this manner, similarly to the area of glass for a housing supported by a frame in which a scratch serving as a fracture origin is easily generated, an escape of the stress can be excluded. In this case, the elastic modulus or deflection of the material of the base 11 can be changed according to the purpose, and a straight material, glass, or a frame whose center is hollow can be appropriately selected.

The sandpaper in the present invention is not limited to polishing paper (abrasive paper, JIS R6252:2006) and examples thereof includes paper in which a base material is coated with a polishing material using an adhesive and paper corresponding to it, for example, polishing cloth (JIS R6251: 2006) or waterproof abrasive paper (JIS R6253:2006).

P12 to P2500 are present in the sandpaper 12 according to the grain size of the included polishing material (JIS R6252: 2006). The polishing material is typically alumina or silicon carbide. When the grain size of sand included in asphalt/concrete is assumed to be in the range of 0.06 mm to 1 mm, P30 to P600 approximately correspond thereto as the grain size of the polishing material included in the sandpaper 12.

For example, when the depth of the compressive stress layer is assumed to be sandpaper such as P30 ($D_3$: 710 μm), P100 ($D_3$: 180 μm), P320 ($d_3$: 66.8 μm), or P600 ($d_3$: 43.0 μm) is selected as the sandpaper containing a polishing material whose size is larger than the depth of the compressive stress layer.

The material or weight of the spherical object 13 can be changed according to the purpose, but a stainless steel ball which is made of stainless steel and is 4 g to 150 g is typically used.

A fracture origin O is generated in an area of the chemically strengthened glass 10, which is deeper than the compressive stress layer on the upper surface 10a side by the polishing material contained in the sandpaper 12 by dropping the spherical object 13 onto the chemically strengthened glass 10 placed on the base 11.

Figure 10A:
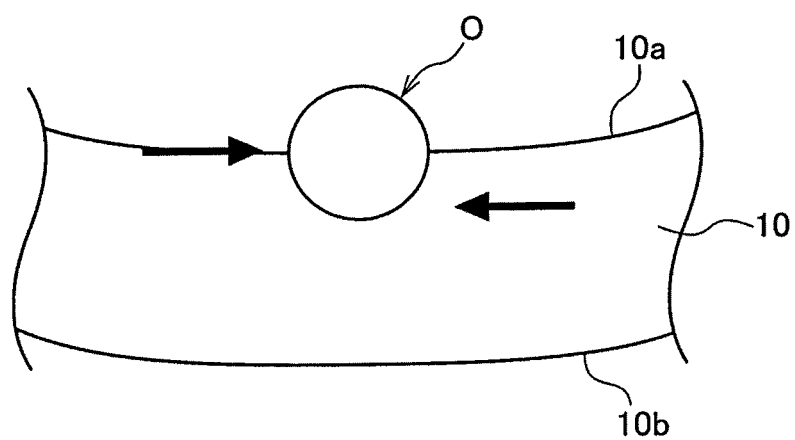
FIGS. 10A and 10B are diagrams schematically illustrating the mechanism of generation of cracking of the chemically strengthened glass in the method of reproducing slow cracking in FIG. 9.
Figure 10B:
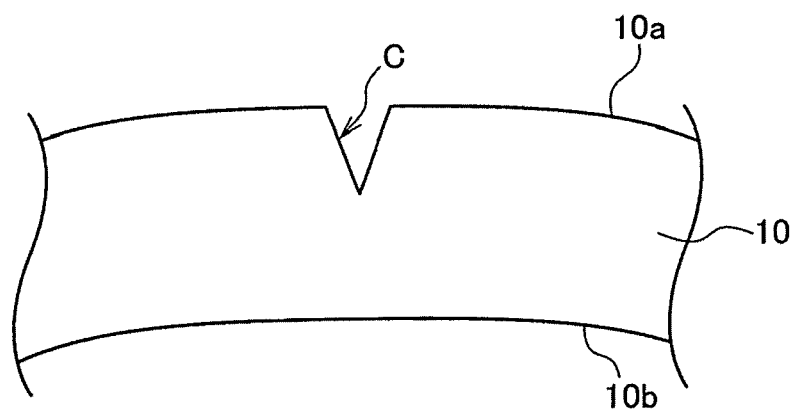

At this time, the compressive stress acts on the fracture origin O so that the tensile stress acts on the surroundings thereof [FIG. 10A]. Consequently, the tensile stress acts on the fracture origin O so that a crack C is extended, and then the cover glass is cracked [FIG. 10B].

Figure 11A:
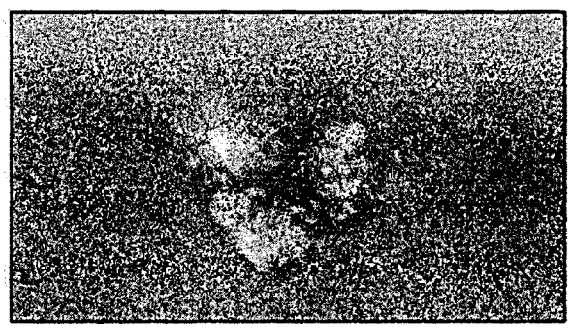
FIG. 11A is a view showing an enlarged photo of sandpaper of P30.
Figure 11B:
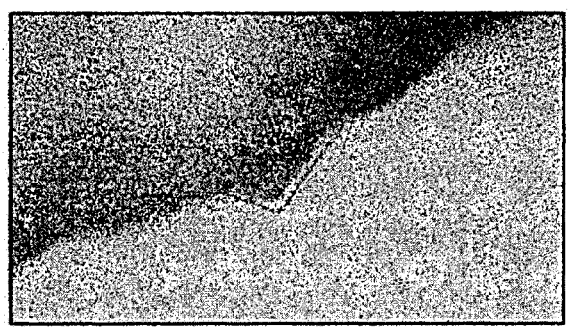
FIG. 11B is a view showing an enlarged photo of asphalt/concrete.
Figure 11C:
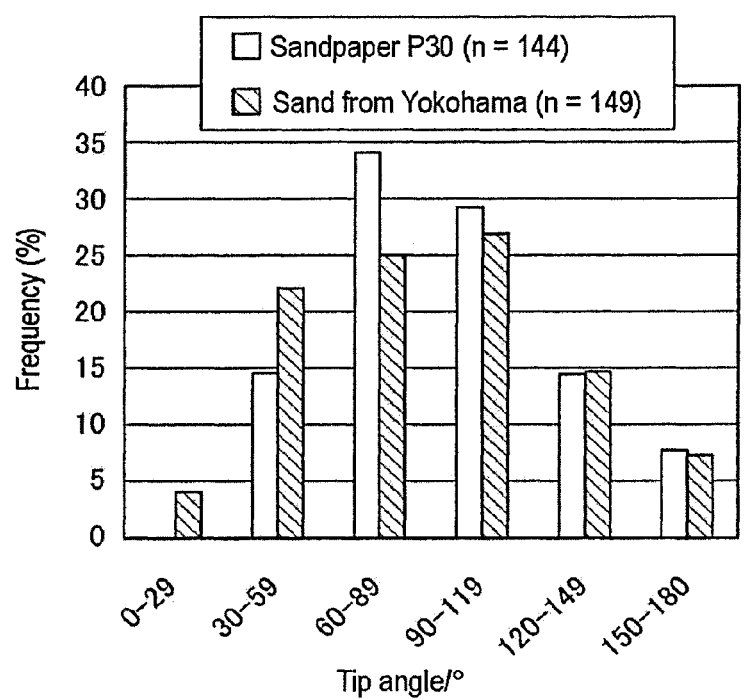
FIG. 11C is a graph showing a tip angle distribution of sandpaper of P30 and a tip angle distribution of sand.

FIG. 11A is an enlarged photo of sandpaper of P30, FIG. 11B is an enlarged photo of asphalt/concrete (collected in Yokohama), and FIG. 11C is a graph showing a tip angle distribution of sandpaper of P30 and a tip angle distribution of sand.

FIG. 11C illustrates the tip angle of the sandpaper or sand as a horizontal axis and the frequency as a vertical axis after 144 sites of the sandpaper and 149 sites of the sand are observed. In the present invention, sandpaper of P30 is selected due to approximation of the shapes of alumina serving as a polishing material contained in the sandpaper of P30 and the shapes of small stones contained in asphalt/concrete.

One embodiment of the present invention is the phase-separated glass (hereinafter, referred to also as phase-separated glass of the present invention) in which the average falling ball height at the time of fracture is 8 cm or more in the sandpaper falling ball test in which the phase-separated glass is placed on the base made of granite and a spherical object having Φ0.75 inches and made of 29 g of stainless steel is dropped from the upper side in a state in which the upper surface of the phase-separated glass is brought into contact with the abrasive surface of the sandpaper of P30 (JIS R6252:2006). The average falling ball height is 8 cm or more and preferably 10 cm or more. In the sandpaper falling ball test, since the average falling ball height at the time of fracture is 8 cm or more, a high resistance to impact from the upper side can be obtained.

By thinly coating the surface with glass having a thermal expansion coefficient smaller than those of the phase-separated glass and the chemically strengthened glass of the present invention, it is possible to add the surface compressive stress due to the thermal expansion difference. When clear glass is used, an effect of improving the appearance due to reflection on the surface and the rear surface of the coated glass can be obtained.

The phase-separated glass and the chemically strengthened glass of the present invention are externally mounted on electronic device. The outer surface of a mobile phone has a configuration in which a display device formed of a liquid crystal panel or an organic EL display and an operation device formed of a button, or a device such as a touch panel, in which a display device and an operation device are integrated on one outer surface, and the surroundings are enclosed by a picture frame material. Another outer surface is configured of a panel. In addition, a frame material is present in a thickness portion of device between one outer surface and another outer surface. These picture frame material and frame material or a panel and a frame material are integrally configured in some cases.

The phase-separated glass and the chemically strengthened glass of the present invention can be used for all of the picture frame material, the panel, and the frame material described above. In addition, the shapes thereof may be flat shapes, curved shapes, or concave shapes or convex shapes in which the picture frame material and the frame material, or the panel and the frame material are integrally confirmed.

The light source of a display device provided in the inside of the electronic device is configured by a source emitting white light such as a light-emitting diode, organic EL, or CCFL. Further, there is a device like an organic EL display in which the light source is not used and a light emitting element emitting white light or the like is included. The visual quality becomes worse when the white light is leaked to the outside of the device through the phase-separated glass. Accordingly, it is preferable that the phase-separated glass have a characteristic of reliably shielding the white light.

The reasons for using the phase-separated glass and the chemically strengthened glass of the present invention for a housing are as follows. The phase-separated glass and the chemically strengthened glass of the present invention are a phase-separated glass obtained by phase-separating the glass, followed by chemically strengthening the glass through the ion exchange treatment, and has characteristics of high mechanical strength and hardness, and excellent heat resistance, electrical property, and chemical durability.

The appearance of the phase-separated glass and the chemically strengthened glass of the present invention exhibits white through diffuse reflection or scattering of light by particles of the dispersed phase in the glass. The phase-separated glass and the chemically strengthened glass of the present invention make white light transmitting through the glass opaque by utilizing scattering of light in the glass. In addition, this is for making light hardly noticeable on the surface side of the glass.

The optical characteristics of the phase-separated glass and the chemically strengthened glass of the present invention can be evaluated through the general transmittance measurement (linear transmittance measurement). In the transmittance of the phase-separated glass and the chemically strengthened glass of the present invention, all of the transmittance T800 of the glass having a thickness of 1 mm with respect to light having a wavelength of 800 nm, the transmittance T600 of the glass having a thickness of 1 mm with respect to light having a wavelength of 600 nm, and the transmittance T400 of the glass having a thickness of 1 mm with respect to light having a wavelength of 400 nm are preferably 30% or less, more preferably 10% or less, still more preferably 5% or less, and most preferably 1% or less.

Co, Mn, Fe, Ni, Cu, Cr, V, Bi, Er, Tm, Nd, Sm, Sn, Ce, Pr, Eu, Ag, or Au may be added to the phase-separated glass and the chemically strengthened glass of the present invention as coloring components. In the case of addition, the content thereof is 5% or less as represented by mol % based on oxides. Fe may be contained as non-colored glass when contained as an impurity in the raw materials in a content of 0.5% or less.

Further, the phase-separated glass and the chemically strengthened glass of the present invention have excellent mechanical strength or the like. Accordingly, the phase-separated glass and the chemically strengthened glass can be preferably used for a housing of portable electronic device such as a mobile phone, which needs high strength with respect to the housing.

The phase-separated glass and the chemically strengthened glass of the present invention may be formed in a concave shape or a convex shape in addition to a flat shape. In this case, the glass molded into a flat sheet or a block may be heated again to be press-molded in a melted state. Further, the phase-separated glass or the chemically strengthened glass may be molded into a desired shape by a so-called direct press method of outflowing melted glass directly on a press mold to be press-molded. Further, a display device of electronic device or a portion corresponding to a connector may be processed simultaneously with the press molding or may be cut-processed after the press molding.

The phase-separated glass and the chemically strengthened glass of the present invention can be suitably used for portable electronic device. Examples of the portable electronic device include communication device or information device which can be used by being carried.

Examples of the communication device include a communication terminal such as a mobile phone, a Personal Handy-phone System (PHS), a smart phone, a Personal Data Assistance (PDA), or a Portable Navigation Device (PND); and a broadcasting receiver such as a portable radio, a portable TV, or a one seg receiver.

Further, examples of the information device include a digital camera, a video camera, a portable music player, a sound recorder, a portable DVD player, a portable game machine, a notebook computer, a tablet PC, an electronic dictionary, an electronic organizer, an electronic book reader, a portable printer, and a portable scanner. The information device is not particularly limited thereto.

It is possible to obtain a portable electronic device with high strength and a good appearance using the phase-separated glass and the chemically strengthened glass of the present invention for the portable electronic device.

The phase-separated glass and the chemically strengthened glass of the present invention with high strength and a good appearance can be applied to a desktop PC, a large TV, a building material, furniture, or a home appliance.

EXAMPLES (1) Transmittance (%)

In regard to the transmittance of glass, a spectral transmittance at a wavelength of 400 nm to 800 nm was obtained using glass having a thickness of 1 mm, in which the upper and lower surfaces were mirror-finished. The measurement of the spectral transmittance was performed in a wavelength range of 400 nm to 1200 nm.

(2) Three-Point Bending Strength (MPa)

The three-point strength was measured by setting a sample shape to have a size of 40 mm×5 mm×1 mm under the conditions of a crosshead speed of 0.5 mm/min and a support base span of 30 mm at room temperature. After a glass sheet whose both surfaces were mirror-polished with cerium oxide was chemically strengthened, a Vickers indenter was inserted on the center of each glass sheet with a predetermined load using a Vickers hardness meter under the conditions of a temperature of 20° C. to 28° C. and a humidity of 40% to 60%, thereby forming indentation, and the bending strength (unit: MPa) was measured.

(3) Value of Surface Compressive Stress (CS) and Depth of Compressive Stress Layer (DOL)

The value of the surface compressive stress (CS) and the depth (DOL) of the compressive stress layer were measured using a surface stress meter FSM-6000 (manufactured by ORIHARA INDUSTRIAL CO., LTD.).

(4) Sandpaper Falling Ball Test

In the sandpaper falling ball test, 15 sheets of chemically strengthened glass cut in dimensions of a thickness of 0.8 mm and a size of 50 mm×50 mm was prepared, followed by sequentially placing 15 sheets of glass on the base made of granite, dropping a spherical object that is Φ0.75 inches and made of 29 g of stainless steel from the upper side in a state in which the upper surface of the glass was brought into contact with the abrasive surface of the sandpaper of P30 (JIS R6252:2006), and calculating a simple average of the falling ball heights at the time of fracture, which was set as the average fracture height. FIG. 16A is a schematic view illustrating the sandpaper falling ball test method.

(5) Edge Strength Test

Figure 17A:
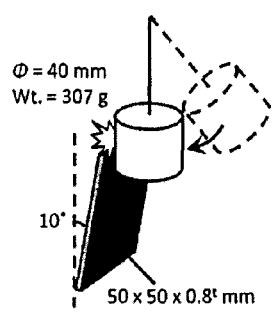
FIG. 17A is a diagram illustrating a method of testing an edge impact test.

The edge strength of the glass sheet was measured according to "JIS R 1601: bending strength test method of fine ceramics in 2008." FIG. 17A is a schematic view illustrating the edge strength test method.

Example 1

(1) Heat Treatment (Phase-Separation Treatment)

A raw material having a composition listed in Table 1 was melted at a temperature of 1650° C. and a sample which was annealed at 730° C. was subjected to a heat treatment. Sodium sulfate having a mass corresponding to 0.1% to 0.4% of the mass was added to the composition listed in Table 1. The mixture was subjected to heat treatment at 900° C. for 4 hours and the phase-separation of the glass was observed using a SEM. The results are shown in FIGS. 1A-1B. FIG. 1A illustrates results of Example 1-1 and FIG. 1B illustrates results of Example 1-2.

As illustrated in FIGS. 1A-1B, phase-separation occurred in both of Examples 1-1 and 1-2 to thereby obtain a milky white sample. The composition of Example 1-2 was obtained by adding 1 mol % of $P_2O_5$ to the case of Example 1-1, but phase-separation occurred at the time when a melt was flown out and whiteness was drastically increased as compared to the case of Example 1-1 by further performing the heat treatment.

As illustrated in FIGS. 1A-1B, it was observed that both of the cases of Examples 1-1 and 1-2 were in the binodal state. In addition, the average particle size of the dispersed phase was 100 nm or less in Example 1-1 and 250 nm or less in Example 1-2. It was found that by adding 1 mol % of $P_2O_5$ the grain size of the dispersed phase was doubled or more and the transmittance was decreased as illustrated in FIG. 2.

(2) Ion Exchange Treatment

Next, in regard to samples of Examples 1-1 and 1-2 which were phase-separated in (1), the sample was chemically strengthened by ion exchange treatment through the immersion in 100% $KNO_3$ molten salts at 450° C. for 92 hours.

The results of observation on the cross section of the sample which has been chemically strengthened in Example 1-1 using SEM-EDX are illustrated in FIG. 3. As illustrated in FIG. 3, it was found that K was diffused from the glass surface to the vicinity of depth of 8 μm.

Further, as a result of measuring the surface compressive stress using glass having a thickness of 1 mm by means of surface stress meter FSM-6000 (manufactured by ORIHARA INDUSTRIAL CO., LTD.), the surface compressive stress was 437 MPa in Example 1-1 and 428 MPa in Example 1-2.

Figure 4:
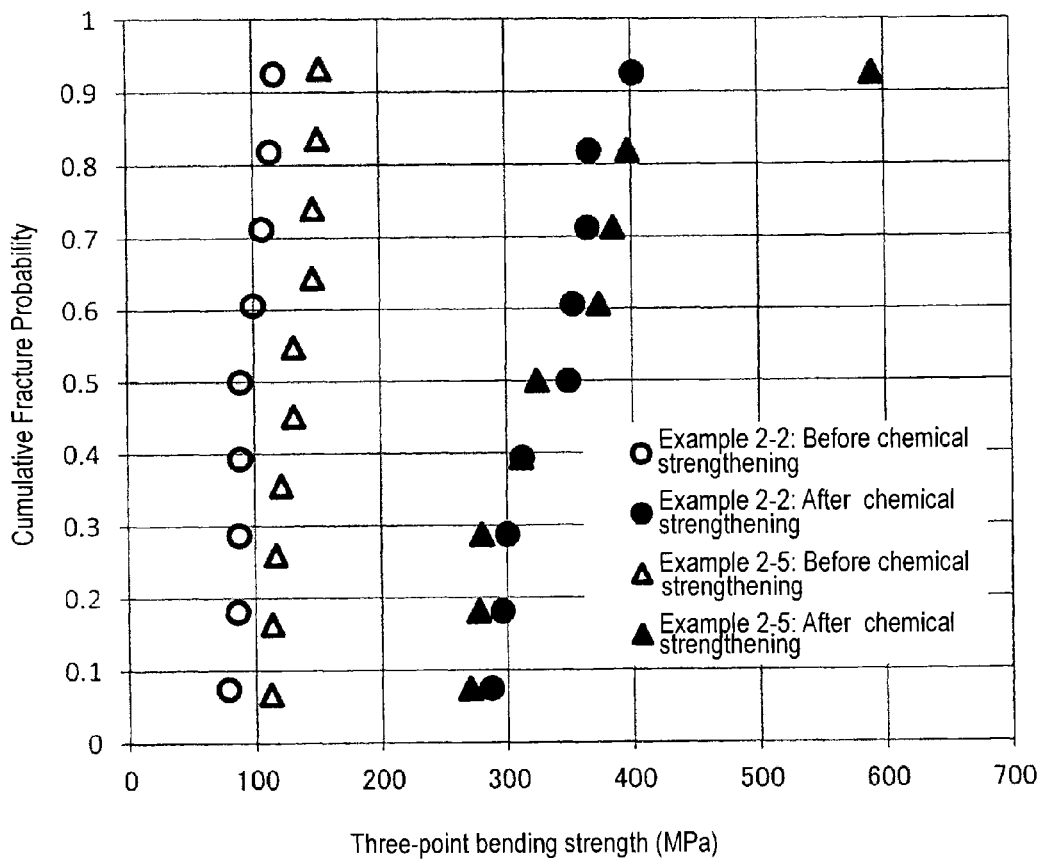
FIG. 4 is a diagram illustrating results of a three-point bending strength test.

Further, the results of measuring three-point bending strength using INSTRON 8561 (INSTRON Co., Ltd.) are shown in FIG. 4 and Table 1. Practically, in order to confirm an effect of the surface compressive stress due to chemical strengthening, three-point bending strength was measured before and after the chemical strengthening. The results are shown in FIG. 4 and Table 1. In FIG. 4, the sample of Example 2-2 was the same as that of Example 1-1, and the sample of Example 2-5 was the same as that of Example 1-2. As shown in FIG. 4 and Table 1, it was found that the strength increased after the chemical strengthening as compared to the strength before the chemical strengthening in both of Examples 1-1 and 1-2.

From these results, it was found that, when the glass was phase-separated, followed by subjecting to ion exchange treatment, glass which was whitened, had low transmittance, and had strength improved by chemical strengthening was obtained. The total light reflectance at a wavelength of 400 nm in Examples 1-1 and 2-1 were 56% and 74%, in terms of a thickness of 1 mm, respectively.

TABLE 1

| | | Example 1-1 | Example 1-2 |
|---|---|---|---|
| Composition (mol %) | $SiO_2$ | 72.0 | 71.2 |
| | MgO | 23.0 | 22.8 |
| | $Na_2O$ | 5.0 | 5.0 |
| | $P_2O_5$ | 0.0 | 1.0 |
| | Total | 100.0 | 100.0 |
| | Annealing temperature (° C.) | 730 | 730 |
| | Tg (° C.) | 705 | 687 |
| Phase-separation treatment | Heating temperature (° C.) | 900 | 900 |
| | Heating time (hour) | 4 | 4 |
| | Phase-separation state | Binodal | Binodal |
| | Transmittance T800 (%) | 81.3 | 14.4 |
| | Transmittance T600 (%) | 52.2 | 0.8 |
| | Transmittance T400 (%) | 5.3 | 0.3 |
| Three-point bending strength (MPa) | Before chemical strengthening (average) | 96.3 | 132.5 |
| | Before chemical strengthening (maximum) | 117.1 | 153.7 |
| | Before chemical strengthening (minimum) | 78.6 | 111.9 |
| | After chemical strengthening (average) | 336.8 | 356.6 |
| | After chemical strengthening (maximum) | 401.7 | 590.4 |

TABLE 1-continued

|  | Example 1-1 | Example 1-2 |
|---|---|---|
| After chemical strengthening (minimum) | 286.8 | 270.1 |

Example 2

(1) Phase-Separation Treatment (Heat Treatment)

Figure 5A:
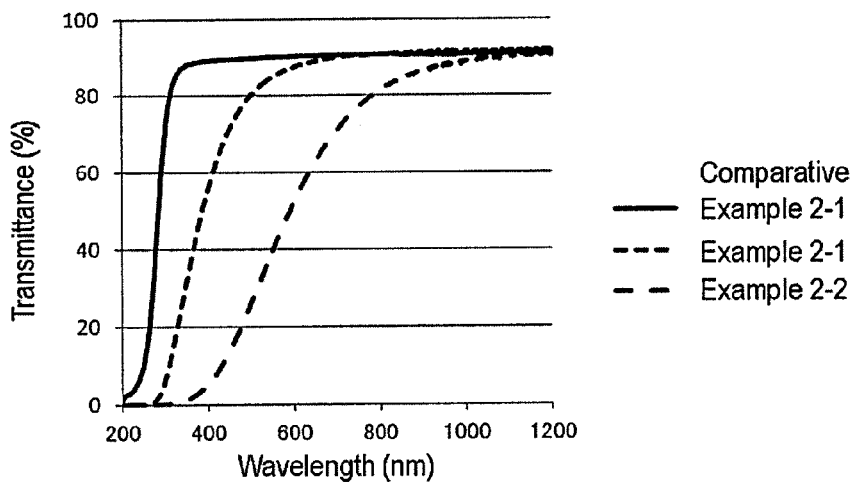
FIGS. 5A-5C are diagrams illustrating measurement results of transmittance of the phase-separated glass.
Figure 5B:
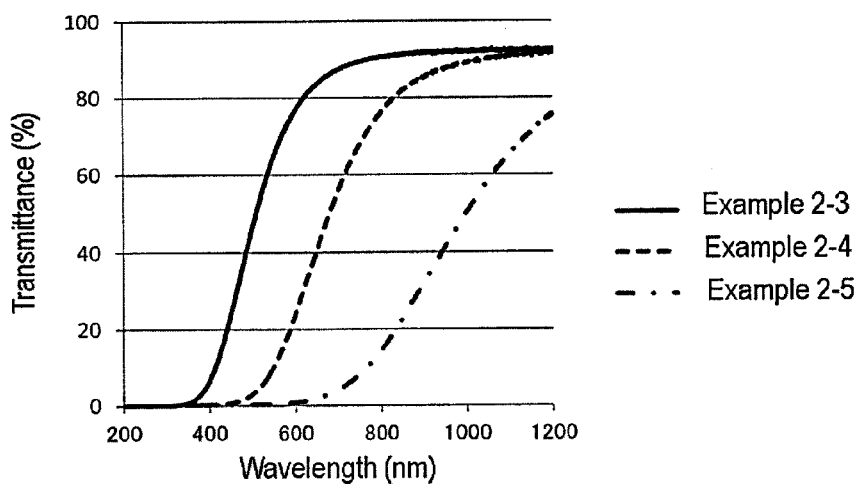
Figure 5C:
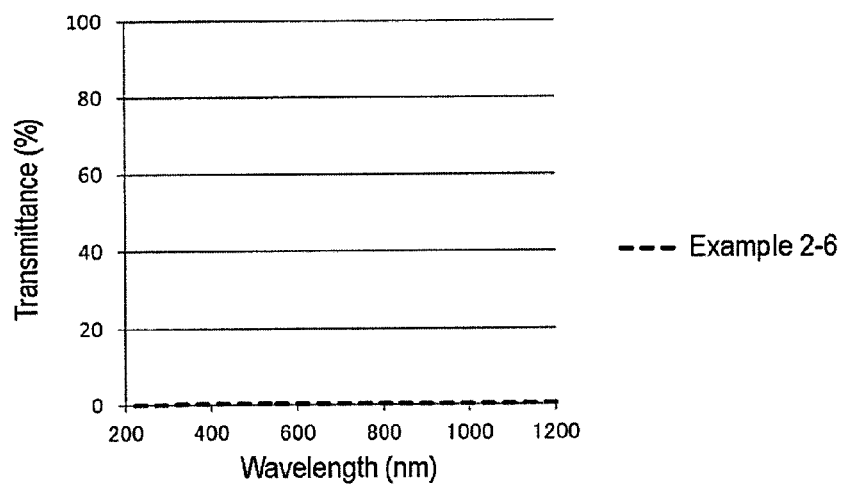

A raw material having a composition listed in Tables 2 to 4 was melted at a temperature of 1650° C. and a sample which was annealed at an annealing temperature listed in Tables 2 to 4 was subjected to a heat treatment and then phase-separated under the conditions listed in Tables 2 to 4. Further, a sample phase-separated in a step of melting, molding, or annealing was described as "non-treated." The results of measuring transmittance of the obtained sample were shown in Tables 2 to 4 and FIGS. 5A-5C. Moreover, the results of observing the phase-separation state using a SEM were shown in Tables 2 to 4.

Further, in regard to Examples 2-3, 2-6, and 2-7, the heat treatment for phase-separation was not performed, but the glass was phase-separated with whiteness due to the heat treatment for melting the glass to obtain low transmittance. In addition, the sample of Example 2-2 was the same as the sample of Example 1-1 and the sample of Example 2-5 was the same as the sample of Example 1-2.

Comparative Example 2

Comparative Example 2-1 in Table 2 was comparative example of glass which was in a state of non-phase-separation.

(2) Ion Exchange Treatment

Next, in regard to a phase-separated sample having a thickness of 1 mm in Examples 2-1 to 2-20, the ion exchange treatment was applied to the sample in 100% $KNO_3$ molten salts under the conditions listed in Tables 2 to 4, thereby performing chemical strengthening, and then, the value of the surface compressive stress (CS) and the depth of the compressive stress layer (DOL) were measured to calculate a ratio of CS to DOL. The results thereof are shown in Tables 2 to 4.

As listed in Tables 2 to 4, it was found that, when the glass was phase-separated, followed by subjecting to ion exchange treatment, glass which was whitened and had low transmittance, and had strength improved through chemical strengthening was obtained.

TABLE 2

|  |  | Comparative Example 2-1 | Example 2-1 | Example 2-2 | Example 2-3 | Example 2-4 | Example 2-5 | Example 2-6 | Example 2-7 | Example 2-8 |
|---|---|---|---|---|---|---|---|---|---|---|
| Composition (mol %) | $SiO_2$ | 72 | 72 | 72 | 71.2 | 71.2 | 71.2 | 69.9 | 69.9 | 69.9 |
|  | $Al_2O_3$ | 0.0 | 0.0 | 0.0 | 0.0 | 0.0 | 0.0 | 0.0 | 1.0 | 1.0 |
|  | MgO | 23.0 | 23.0 | 23.0 | 22.8 | 22.8 | 22.8 | 22.3 | 22.3 | 22.3 |
|  | $Na_2O$ | 5.0 | 5.0 | 5.0 | 5.0 | 5.0 | 5.0 | 4.9 | 4.9 | 4.9 |
|  | $P_2O_5$ | 0.0 | 0.0 | 0.0 | 1.0 | 1.0 | 1.0 | 2.9 | 1.9 | 1.9 |
|  | Total | 100.0 | 100.0 | 100.0 | 100.0 | 100.0 | 100.0 | 100.0 | 100.0 | 100.0 |
|  | Annealing temperature (° C.) | 730 | 730 | 730 | 730 | 730 | 730 | 730 | 730 | 730 |
|  | Tg (° C.) | 705 | 705 | 705 | 687 | 687 | 687 | 649 | 678 | 678 |
| Phase-separation treatment | Heating temperature (° C.) | Non-treated | 850 | 900 | Non-treated | 850 | 900 | Non-treated | Non-treated | 800 |
|  | Heating time (hour) |  | 4 | 4 |  | 4 | 4 |  |  | 4 |
|  | Phase-separation state | None | Binodal | Binodal | Binodal | Binodal | Binodal | Binodal | Binodal | Binodal |
|  | Transmittance T800 (%) | 91.0 | 90.8 | 81.3 | 90.6 | 76.0 | 14.4 | 0.4 | 7.9 | 12.9 |
|  | Transmittance T600 (%) | 90.2 | 87.4 | 52.2 | 7.7 | 23.8 | 0.8 | 0.3 | 0.5 | 0.7 |
|  | Transmittance T400 (%) | 89.1 | 55.5 | 5.3 | 6.5 | 0.3 | 0.3 | 0.3 | 0.2 | 0.2 |
| CS (MPa)/ DOL (μm) | Chemically strengthening treatment (400° C., 13 hours) | — | — | — | — | — | — | — | 230/7 | — |
|  | Chemically strengthening treatment (450° C., 19 hours) | — | — | — | — | — | — | — | — | — |
|  | Chemically strengthening treatment (450° C., 65 hours) | — | — | — | — | — | — | Impossible to measure | 371/27 | 358/25 |
|  | Chemically strengthening treatment (450° C., 92 hours) | — | — | 437/7 | — | — | 428/7 | Impossible to measure | — | — |
|  | Chemically strengthening treatment (450° C., 138 hours) | — | — | — | 419/7 | 440/7 | 418/7 | — | — | — |
|  | Chemically strengthening treatment (500° C., 19 hours) | — | — | — | — | — | 458/6 | — | 402/25 | — |
|  | Chemically strengthening treatment (500° C., 63 hours) | — | — | — | — | — | — | — | — | — |

TABLE 3

|  |  | Comparative Example 2-9 | Example 2-10 | Example 2-11 | Example 2-12 | Example 2-13 | Example 2-14 | Example 2-15 | Example 2-16 | Example 2-17 |
|---|---|---|---|---|---|---|---|---|---|---|
| Composition (mol %) | $SiO_2$ | 69.9 | 69.9 | 70.9 | 70.9 | 70.9 | 69.3 | 69.3 | 69.3 | 67.9 |
|  | $Al_2O_3$ | 1.0 | 1.0 | 0.0 | 0.0 | 0.0 | 1.0 | 1.0 | 1.0 | 1.9 |
|  | MgO | 22.3 | 22.3 | 22.7 | 22.7 | 22.7 | 20.8 | 20.8 | 20.8 | 17 |
|  | $ZrO_3$ | 0.0 | 0.0 | 0.0 | 0.0 | 0.0 | 1.0 | 1.0 | 1.0 | 0.0 |
|  | $Na_2O$ | 4.9 | 4.9 | 4.9 | 4.9 | 4.9 | 5.9 | 5.9 | 5.9 | 9.4 |
|  | $P_2O_5$ | 1.9 | 1.9 | 1.0 | 1.0 | 1.0 | 2.0 | 2.0 | 2.0 | 3.8 |
|  | $La_2O_3$ | 0.0 | 0.0 | 0.5 | 0.5 | 0.5 | 0.0 | 0.0 | 0.0 | 0.0 |
|  | Total | 100.0 | 100.0 | 100.0 | 100.0 | 100.0 | 100.0 | 100.0 | 100.0 | 100.0 |
| Annealing temperature (° C.) |  | 730 | 730 | 730 | 730 | 730 | 730 | 730 | 730 | 700 |
| Tg (° C.) |  | 678 | 678 | 683 | 683 | 683 | 674 | 674 | 674 | 588 |
| Phase-separation treatment | Heating temperature (° C.) | 850 | 900 | 800 | 850 | 900 | 800 | 850 | 900 | 800 |
|  | Heating time (hour) | 4 | 4 | 4 | 4 | 4 | 4 | 4 | 4 | 4 |
| Phase-separation state |  | Binodal | Binodal | Binodal | Binodal | Binodal | Binodal | Binodal | Binodal |  |
| Transmittance T800 (%) |  | 5.4 | 1.3 | 85.1 | 69.6 | 6.4 | 92.2 | 87.1 | 14.2 | 81.3 |
| Transmittance T600 (%) |  | 0.4 | 0.3 | 44.6 | 13.4 | 0.4 | 87.8 | 55.2 | 1.2 | 48.9 |
| Transmittance T400 (%) |  | 0.2 | 0.2 | 0.4 | 0.2 | 0.2 | 31.4 | 0.9 | 0.3 | 6.4 |
| CS (MPa)/DOL (μm) | Chemically strengthening treatment (400° C., 13 hours) | 233/8 | 240/8 | — | — | — | — | — | — | — |
|  | Chemically strengthening treatment (450° C., 6 hours) | — | — | — | — | — | — | — | — | 557/17 |
|  | Chemically strengthening treatment (450° C., 19 hours) | — | — | — | — | — | 461/18 | 457/17 | 441/16 | — |
|  | Chemically strengthening treatment (450° C., 65 hours) | — | 362/23 | — | — | — | — | — | — | — |
|  | Chemically strengthening treatment (450° C., 92 hours) | — | — | — | — | — | — | — | — | — |
|  | Chemically strengthening treatment (500° C., 19 hours) | 346/24 | 381/15 | — | — | — | — | — | — | — |
|  | Chemically strengthening treatment (500° C., 63 hours) | — | — | 446/10 | 439/10 | 469/9 | 439/53 | 439/53 | 448/50 | — |

TABLE 4

|  |  | Example 2-18 | Example 2-19 | Example 2-20 |
|---|---|---|---|---|
| Composition (mol %) | $SiO_2$ | 67.9 | 64.4 | 63.2 |
|  | $Al_2O_3$ | 1.9 | 5.0 | 4.9 |
|  | MgO | 17 | 10.5 | 10.8 |
|  | CaO | 0.0 | 0.1 | 0.0 |
|  | $ZrO_2$ | 0.0 | 0.5 | 2.5 |
|  | $Na_2O$ | 9.4 | 12.5 | 11.8 |
|  | $K_2O$ | 0.0 | 4.0 | 3.9 |
|  | $P_2O_5$ | 3.8 | 3.0 | 2.9 |
|  | Total | 100.0 | 100.0 | 100.0 |
| Annealing temperature (° C.) |  | 700 | 650 | 650 |
| Tg (° C.) |  | 588 | 584 | 625 |
| Phase-separation treatment | Heating temperature (° C.) | 850 | 900 | 900 |
|  | Heating time (hour) | 4 | 4 | 4 |
| Phase-separation state |  | — | — | — |
| Transmittance T800 (%) |  | 13.2 | 92.2 | 91.2 |
| Transmittance T600 (%) |  | 2.5 | 87.9 | 85.5 |
| Transmittance T400 (%) |  | 0.4 | 66.3 | 55.2 |
| CS (MPa)/DOL (μm) | Chemically strengthening treatment (450° C., 6 hours) | 526/17 | 570/62 | 746/52 |
|  | Chemically strengthening treatment (400° C., 13 hours) | — | — | — |
|  | Chemically strengthening treatment (450° C., 19 hours) | — | — | — |
|  | Chemically strengthening treatment (450° C., 65 hours) | — | — | — |
|  | Chemically strengthening treatment (450° C., 92 hours) | — | — | — |
|  | Chemically strengthening treatment (450° C., 138 hours) | — | — | — |
|  | Chemically strengthening treatment (500° C., 19 hours) | — | — | — |
|  | Chemically strengthening treatment (500° C., 63 hours) | — | — | — |

Example 3

The glass described below was used as crystallized glass, phase-separated glass (binodal), or reference glass.

(1) Crystallized Glass

The glass having a composition of 50.4% of $SiO_2$, 22.7% of $Al_2O_3$, 6.9% of $TiO_2$, 12.5% of $Na_2O$, and 7.5% of $K_2O$ as represented by mol % basis was subjected to the heat treatment at 850° C. for 4 hours, and then, the glass which was subjected to the heat treatment at 1100° C. for 4 hours, thereby obtaining crystallized glass.

The crystallized glass was chemically strengthened through the ion exchange treatment with $KNO_3$ at 450° C. for 30 hours.

(2) Phase-Separated Glass

The glass having a composition of 59.7% of $SiO_2$, 3.3% of $Al_2O_3$, 3.9% of $B_2O_3$, 14.9% of MgO, 4.1% of $ZrO_2$, 9.1% of $Na_2O$, and 5.0% of $P_2O_5$ as represented by mol % was subjected to the heat treatment at 900° C. for 4 hours, thereby obtaining phase-separated glass.

The phase-separated glass was chemically strengthened through the ion exchange treatment with $KNO_3$ at 450° C. for 6 hours.

(3) Reference Glass

The glass having a composition of 63.1% of $SiO_2$, 7.9% of $Al_2O_3$, 12.3% of $Na_2O$, 10.3% of MgO, 3.9% of $K_2O$, and 0.4% of $ZrO_2$ as represented by mol %, to which a colorant was added, was used as reference glass.

The reference glass was chemically strengthened through the ion exchange treatment with $KNO_3$ at 425° C. for 6 hours.

The results of the ion exchange treatment (also noted as IOX) on the crystallized glass, the phase-separated glass, and the reference glass, and the results of measuring the value of surface compressive stress (CS) and the depth of the compressive stress layer (DOL), and photos of glass fractured in the three-point bending strength test, and schematic views are illustrated in FIG. 13.

As illustrated in FIG. 13, the depth of the compressive stress layer was less than 5 µm although the crystallized glass was subjected to the ion exchange treatment for 30 hours, which was a long period of time. On the other hand, the depth of the compressive stress layer was 21 µm, which was deep, through the ion exchange treatment applied to the phase-separated glass for 6 hours, which was a short period of time, and resistance to scratch was exceedingly high. The obtained results of the phase-separated glass were excellent even when compared to those of the reference glass.

Further, as illustrated in photos and schematic views in FIG. 13, in regard to the cracked manner of the glass fractured in the three-point bending strength test, the crystallized glass was cracked into pieces, but the phase-separated glass had a shape remaining to some extent. Further, the phase-separated glass to which the ion exchange treatment had been applied was cracked sharply as compared to the case of the crystallized glass to which the ion exchange treatment had been applied, and safety was high because the glass was not shattered.

Example 4

Observation in the Case of Inserting of Indenter

Figure 12:
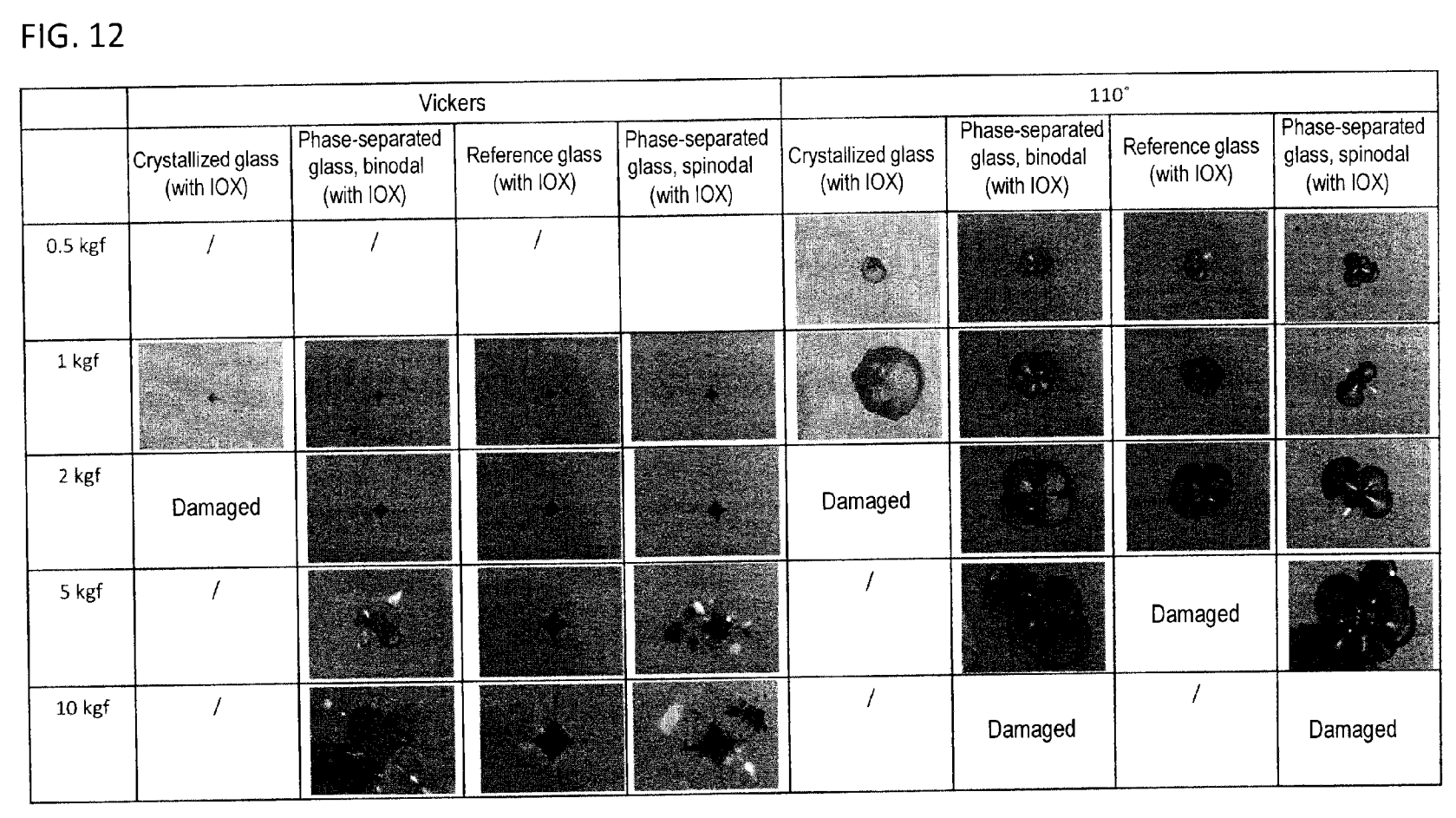

With regard to the crystallized glass, the phase-separated glass, and the reference glass which were prepared in the same manner as those of Example 3 and to which the ion exchange treatment (also noted as IOX) was applied respectively, a Vickers or an indenter having a form of a square pyramid having a facing angle of 110° was inserted into the glass with each load. The results are illustrated in FIG. 12 (n=10). In FIG. 12, "damaged" means that the glass was cracked at the time of being scratched.

As illustrated in FIG. 12, since the depth of the compressive stress layer was not deep in the crystallized glass to which the ion exchange treatment was applied, it was found that the glass was likely to be cracked by being scratched. In contrast, the phase-separated glass to which the ion exchange treatment was applied was scratched due to the insertion of the indenter but was difficult to be fractured, and exhibits higher resistance with respect to a scratch as compared to the reference glass to which the ion exchange treatment was applied in the case of using the indenter having the angle of 110°.

Example 5

Three-Point Bending Strength Test

With regard to the crystallized glass, the phase-separated glass, and the reference glass, which were prepared in the same manner as those of Example 3, a Vickers indenter was inserted and a destructive three-point bending strength test was performed. The results thereof are illustrated in FIGS. 14A-14C.

As illustrated in FIG. 14A, the three-point bending strength of the crystallized glass to which the ion exchange treatment was applied significantly decreased when it was scratched using an indenter, and the decrease rate of the three-point bending strength in 0 kg to 2 kg of indenter insertion load was 100%. This was because the depth of the compressive stress layer formed by the ion exchange treatment in the crystallized glass was not deep.

Meanwhile, as illustrated in FIG. 14B, the three-point bending strength of the phase-separated glass to which the ion exchange treatment was applied was not decreased when it was scratched, and the strength thereof was approximately the same as that of the reference glass illustrated in FIG. 14C. Accordingly, it was found that resistance to scratch was high. Further, the decrease rate of the three-point bending strength in 0 kg to 2 kg of indenter insertion load was 52.8% in the case of phase-separated glass and 58.2% in the case of reference glass.

Example 6

Three-Point Bending Strength Test

In regard to the phase-separated glass prepared in the same manner as that of Example 3, the three-point bending strength test was performed by destruction with a Vickers indenter in the case in which the ion exchange treatment was performed and in the case in which the ion exchange treatment was not performed. The results are illustrated in FIGS. 15A and 15B.

As illustrated in FIG. 15A, it was found that, as compared to the case where the ion exchange treatment was not performed [FIG. 15B], the strength with respect to a scratch in the phase-separated glass to which the ion exchange treatment was applied considerably improved.

Example 7

Acid Resistance Test, Alkali Resistance Test, and Water Resistance Test

With regard to the crystallized glass, the phase-separated glass, and the reference glass, which were prepared in the same manner as those of Example 3 and to which the ion exchange treatment (also noted as IOX) was applied respectively, an acid resistance test, an alkali resistance test, and a water resistance test were performed under the conditions listed in Table 5. The concentration of hydrochloric acid was 0.1M and the concentration of sodium hydroxide was 0.1 M (here, the test time in the acid resistance test for the crystalline glass was 2 hours). The results are shown in Table 6.

TABLE 5

|  | Acid resistance test | Alkali resistance test | Water resistance test |
|---|---|---|---|
| Solution | Hydrochloric acid | Sodium hydroxide | Purified water |
| Concentration | 0.1 M | 0.1 M | — |
| Temperature | 90° C. | 90° C. | 90° C. |
| Test time | 20 hours | 20 hours | 20 hours |

TABLE 6

|  |  | Crystallized glass | Phase-separated glass | Reference glass |
|---|---|---|---|---|
| Reduced mass (mg/cm²) | Acid resistance test | 27.0 | 0.1 | 0.1 |
|  | Alkali resistance test | 1.5 | 0.5 | 0.9 |
|  | Water resistance test | 0.0 | 0.1 | 0.6 |

As shown in Table 6, in regard to the acid resistance, it was found that the weight of the phase-separated glass was basically not changed similarly to the case of the reference glass and high acid resistance was shown, but the crystallized glass had low acid resistance. Further, the glass surface of the crystallized glass was peeled off due to the acid resistance test.

Moreover, in regard to the alkali resistance, it was found that the phase-separated glass had high alkali resistance compared to the case of the crystallized glass. Further, the surface of the reference glass became rough and color unevenness was generated due to the alkali resistance test.

Example 8

Sandpaper Falling Ball Test

In regard to the crystallized glass, the phase-separated glass, and the reference glass, which were prepared in the same manner as those of Example 3 and to which the ion exchange treatment (also noted as IOX) was applied respectively, the sandpaper falling ball test was performed. The results thereof are illustrated in FIGS. 16B and 16C.

As illustrated in FIG. 16B, the average falling ball height at the time of fracture in the case of the crystallized glass to which the ion exchange treatment was applied was low and the glass was shattered into pieces as illustrated in FIG. 16C. In contrast, as illustrated in FIG. 16B, the average falling ball height at the time of fracture in the case of the phase-separated glass to which the ion exchange treatment was applied was high and the glass was not shattered into pieces, as illustrated in FIG. 16C, unlike the case of the reference glass to which the ion exchange treatment was applied. From these results, in the phase-separated glass to which the ion exchange treatment was applied, it was found that an impact from the upper side was strong and the strength with respect to the crystallized glass to which the ion exchange treatment was applied was high.

Example 9

Edge Strength Test

In regard to the crystallized glass, the phase-separated glass, and the reference glass which were prepared in the same manner as those of Example 3 in the case where the ion exchange treatment (also noted as IOX) was not applied respectively or in the case where the ion exchange treatment was applied respectively, the edge strength test was performed. The results are illustrated in FIGS. 17B and 18.

Figure 17B:
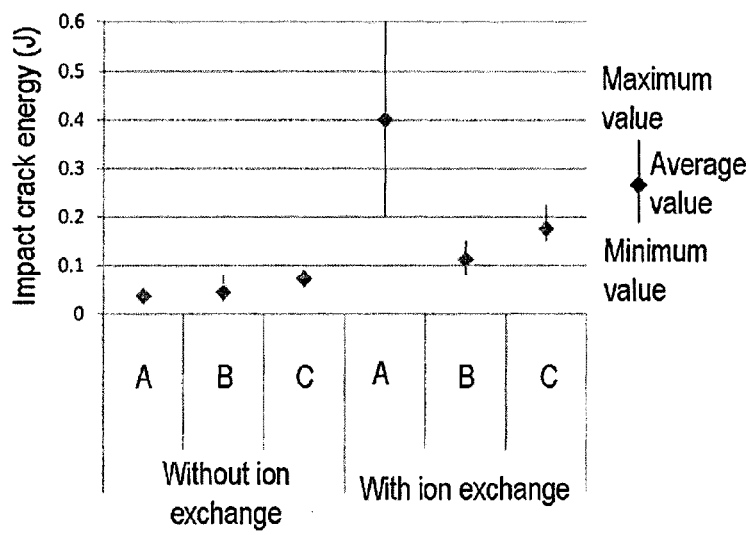
FIG. 17B is a diagram illustrating test results of the edge impact test.

As illustrated in FIG. 17B, the average strength of the crystallized glass, the phase-separated glass, and the reference glass in the case where the ion exchange treatment was not applied respectively was 0.07 J or less in all cases. Further, as illustrated in FIG. 17B, in the case where the ion exchange treatment was applied respectively, the average strength was 0.1 J or more in all cases. In the case of the phase-separated glass to which the ion exchange treatment was not applied, the average strength was 0.04 J, but the average strength of the phase-separated glass to which the ion exchange treatment was applied was 0.11 J, which was improved.

Figure 18:
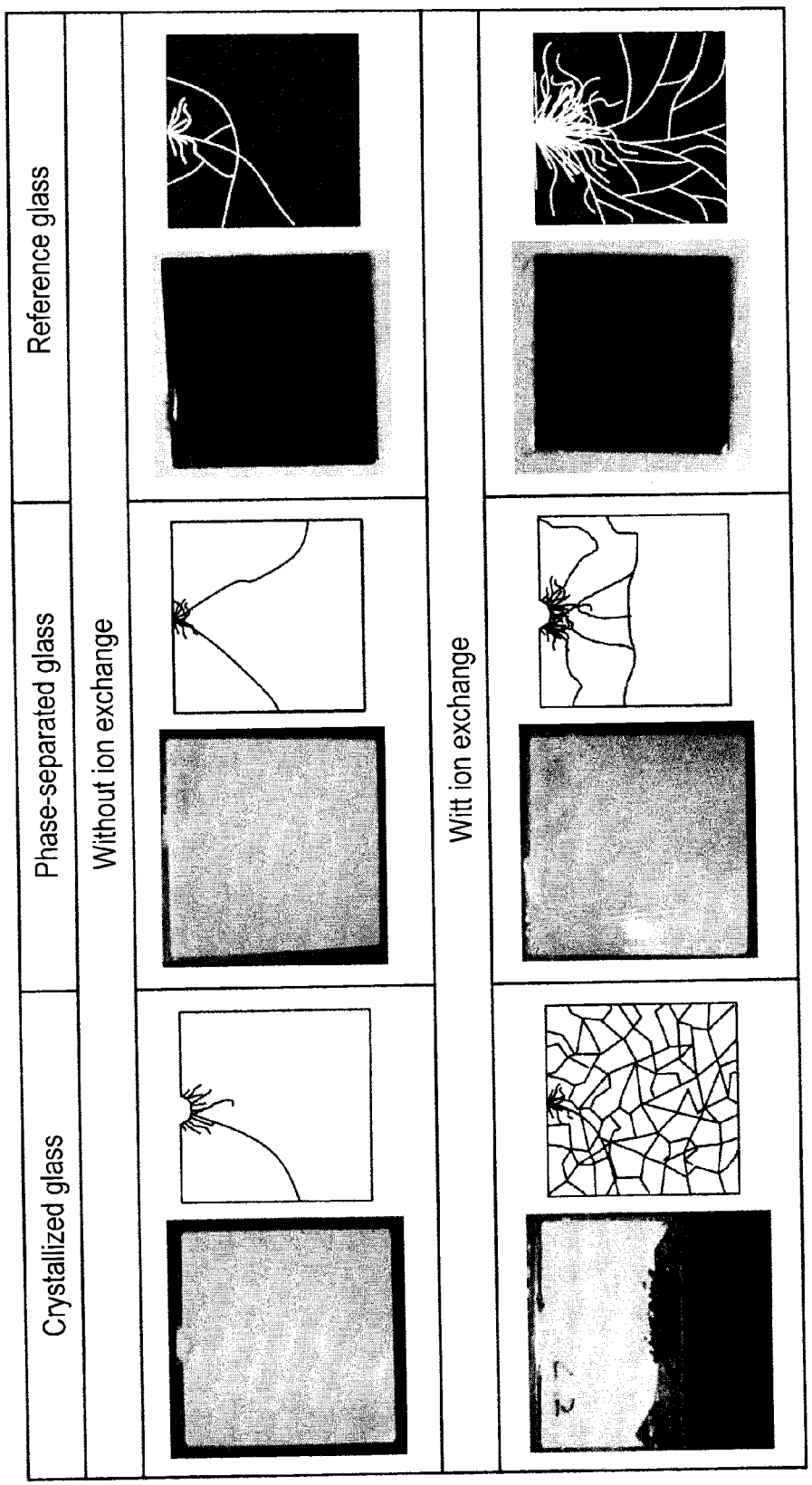
FIG. 18 illustrates photos and schematic views after the edge impact test is performed in regard to crystallized glass, phase-separated glass, and reference glass to which the ion exchange treatments has been applied and has not been applied, respectively.

On the other hand, in the crystallized glass to which the ion exchange treatment was applied as illustrated in FIG. 17B, the average impact crack energy was approximately 0.4 J, but even when the average impact crack energy of the glass in the photos and figures illustrated in FIG. 18 was 0.2 J, the glass was shattered into pieces. In contrast, as illustrated in FIG. 18, it was found that the phase-separated glass was not shattered into pieces and resistance thereof to the edge impact was high.

Example 10

Raw materials having the compositions listed in Tables 7 to 13 were melted at 1550° C. to 1650° C. Sodium sulfate in a weight equivalent to 0.1% to 0.4% of the mass was added to the compositions listed in Tables 7 to 13. In Tables 7 to 13, conditions of the heat treatment of the phase-separated glass and results of measuring the transmittance, the surface compressive stress (CS), and the depth of the compressive stress (DOL) are listed. In Table 7, the examples 10-1 and 10-3 to 10-70 are Examples and the example 10-2 is Reference Example.

TABLE 7

|  |  | Examples | | | | | | | | | |
|---|---|---|---|---|---|---|---|---|---|---|---|
|  |  | 10-1 | 10-2 | 10-3 | 10-4 | 10-5 | 10-6 | 10-7 | 10-8 | 10-9 | 10-10 |
| Composition (mol %) | $SiO_2$ | 68.2 | 71.7 | 67.4 | 67.4 | 67.4 | 66.0 | 70.5 | 66.6 | 66.6 | 66.6 |
|  | $Al_2O_3$ | 1.0 | 4.6 | 1.9 | 1.9 | 1.9 | 1.8 | 4.5 | 2.8 | 2.8 | 2.8 |
|  | $B_2O_3$ | 0.0 | 0.0 | 0.0 | 0.0 | 0.0 | 0.0 | 0.0 | 0.0 | 0.0 | 0.0 |
|  | MgO | 20.5 | 6.7 | 16.8 | 16.8 | 16.8 | 16.5 | 6.6 | 16.7 | 16.7 | 16.7 |
|  | $TiO_2$ | 0.0 | 2.9 | 0.0 | 0.0 | 0.0 | 0.0 | 2.8 | 0.0 | 0.0 | 0.0 |
|  | $ZrO_2$ | 2.4 | 0.0 | 0.9 | 0.9 | 0.9 | 2.8 | 0.0 | 0.9 | 0.9 | 0.9 |
|  | $Na_2O$ | 5.9 | 13.1 | 9.3 | 9.3 | 9.3 | 9.2 | 12.8 | 9.3 | 9.3 | 9.3 |
|  | $La_2O_3$ | 0.0 | 0.0 | 0.0 | 0.0 | 0.0 | 0.0 | 0.0 | 0.0 | 0.0 | 0.0 |
|  | $P_2O_5$ | 2.0 | 1.0 | 3.7 | 3.7 | 3.7 | 3.7 | 2.8 | 3.7 | 3.7 | 3.7 |

TABLE 7-continued

|  |  | Examples | | | | | | | | | |
|---|---|---|---|---|---|---|---|---|---|---|---|
|  |  | 10-1 | 10-2 | 10-3 | 10-4 | 10-5 | 10-6 | 10-7 | 10-8 | 10-9 | 10-10 |
|  | Total | 100.0 | 100.0 | 100.0 | 100.0 | 100.0 | 100.0 | 100.0 | 100.0 | 100.0 | 100.0 |
|  | Tg (° C.) | 691 | 576 | 616 | 616 | 616 | 643 | 616 | 634 | 634 | 634 |
| Phase-separation treatment | Temperature of heat treatment | 900 | 900 | 900 | 900 | 900 | 900 | 900 | 850 | 900 | 950 |
|  | Time for heat treatment | 4 | 4 | 4 | 8 | 32 | 32 | 4 | 4 | 32 | 4 |
| Transmittance (%) | at wavelength of 800 nm | 17.5 | 92.2 | 81.7 | 72.4 | 52.5 | 67.7 | 90.8 | 83.7 | 49.2 | 66.5 |
|  | at wavelength of 600 nm | 1.4 | 91.7 | 49.3 | 36.5 | 22.7 | 37.3 | 85.2 | 48.9 | 16.0 | 26.2 |
|  | at wavelength of 400 nm | 0.3 | 86.7 | 7.9 | 4.9 | 1.8 | 6.8 | 54.1 | 5.1 | 0.8 | 2.0 |
| CS (MPa)/DOL (μm) | Ion exchange treatment (400° C., 6 hours) | — | — | — | — | — | — | — | — | — | — |
|  | Ion exchange treatment (400° C., 13 hours) | — | 473/51 | — | — | — | — | — | — | — | — |
|  | Ion exchange treatment (450° C., 6 hours) | — | — | 586/20 | 630/19 | 622/19 | 700/20 | 554/43 | 630/24 | 649/24 | 629/24 |
|  | Ion exchange treatment (450° C., 19 hours) | 454/16 | — | — | — | — | — | — | — | — | — |
|  | Chemically strengthening treatment (450° C., 92 hours) | — | — | — | — | — | — | — | — | — | — |

TABLE 8

|  |  | Examples | | | | | | | | | |
|---|---|---|---|---|---|---|---|---|---|---|---|
|  |  | 10-11 | 10-12 | 10-13 | 10-14 | 10-15 | 10-16 | 10-17 | 10-18 | 10-19 | 10-20 |
| Composition (mol %) | SiO₂ | 66.6 | 65.5 | 65.5 | 65.5 | 65.5 | 66.0 | 66.0 | 66.0 | 66.0 | 66.0 |
|  | Al₂O₃ | 2.8 | 1.8 | 1.8 | 1.8 | 1.8 | 3.7 | 3.7 | 3.7 | 3.7 | 3.7 |
|  | B₂O₃ | 0.0 | 0.0 | 0.0 | 0.0 | 0.0 | 0.0 | 0.0 | 0.0 | 0.0 | 0.0 |
|  | MgO | 16.7 | 16.4 | 16.4 | 16.4 | 16.4 | 16.5 | 16.5 | 16.5 | 16.5 | 16.5 |
|  | TiO₂ | 0.0 | 0.0 | 0.0 | 0.0 | 0.0 | 0.0 | 0.0 | 0.0 | 0.0 | 0.0 |
|  | ZrO₂ | 0.9 | 2.7 | 2.7 | 2.7 | 2.7 | 0.9 | 0.9 | 0.9 | 0.9 | 0.9 |
|  | Na₂O | 9.3 | 9.1 | 9.1 | 9.1 | 9.1 | 9.2 | 9.2 | 9.2 | 9.2 | 9.2 |
|  | La₂O₃ | 0.0 | 0.0 | 0.0 | 0.0 | 0.0 | 0.0 | 0.0 | 0.0 | 0.0 | 0.0 |
|  | P₂O₅ | 3.7 | 4.5 | 4.5 | 4.5 | 4.5 | 3.7 | 3.7 | 3.7 | 3.7 | 3.7 |
|  | Total | 100.0 | 100 | 100 | 100 | 100 | 100 | 100 | 100 | 100 | 100 |
|  | Tg (° C.) | 634 | 626 | 626 | 626 | 626 | 648 | 648 | 648 | 648 | 648 |
| Phase-separation treatment | Temperature of heat treatment | 950 | 900 | 900 | 950 | 950 | 850 | 900 | 900 | 950 | 950 |
|  | Time for heat treatment | 32 | 4 | 32 | 4 | 32 | 4 | 4 | 32 | 4 | 32 |
| Transmittance (%) | at wavelength of 800 nm | 29.9 | 66.3 | 47.5 | 64.2 | 39.4 | 76.3 | 74.6 | 44.0 | 66.0 | 24.6 |
|  | at wavelength of 600 nm | 8.3 | 31.9 | 21.5 | 30.0 | 15.8 | 31.5 | 29.0 | 10.5 | 21.1 | 5.0 |
|  | at wavelength of 400 nm | 0.5 | 5.0 | 1.8 | 4.2 | 1.0 | 1.6 | 1.5 | 2.8 | 1.0 | 0.4 |
| CS (MPa)/DOL (μm) | Ion exchange treatment (400° C., 6 hours) | — | — | — | — | — | — | — | — | — | — |
|  | Ion exchange treatment (400° C., 13 hours) | — | — | — | — | — | — | — | — | — | — |
|  | Ion exchange treatment (450° C., 6 hours) | 650/24 | 690/19 | 684/18 | 679/18 | 657/19 | 641/28 | 636/28 | 655/28 | 645/28 | 652/28 |
|  | Ion exchange treatment (450° C., 19 hours) | — | — | — | — | — | — | — | — | — | — |
|  | Chemically strengthening treatment (450° C., 92 hours) | — | — | — | — | — | — | — | — | — | — |

TABLE 9

|  |  | Examples | | | | | | | | | |
|---|---|---|---|---|---|---|---|---|---|---|---|
|  |  | 10-21 | 10-22 | 10-23 | 10-24 | 10-25 | 10-26 | 10-27 | 10-28 | 10-29 | 10-30 |
| Composition (mol %) | SiO₂ | 66.6 | 66.6 | 64.9 | 63.8 | 63.8 | 68.2 | 62.1 | 62.0 | 62.0 | 62.0 |
|  | Al₂O₃ | 1.9 | 1.9 | 1.8 | 1.8 | 1.8 | 0.0 | 3.4 | 5.2 | 5.2 | 5.2 |
|  | B₂O₃ | 0.0 | 0.0 | 0.0 | 0.0 | 0.0 | 4.3 | 0.0 | 0.0 | 0.0 | 0.0 |

TABLE 9-continued

|  |  | Examples | | | | | | | | | |
|---|---|---|---|---|---|---|---|---|---|---|---|
|  |  | 10-21 | 10-22 | 10-23 | 10-24 | 10-25 | 10-26 | 10-27 | 10-28 | 10-29 | 10-30 |
|  | MgO | 18.5 | 16.7 | 16.2 | 15.9 | 15.9 | 21.8 | 15.5 | 15.5 | 15.5 | 15.5 |
|  | $TiO_2$ | 0.0 | 0.0 | 0.0 | 0.0 | 0.0 | 0.0 | 0.0 | 0.0 | 0.0 | 0.0 |
|  | $ZrO_2$ | 0.0 | 0.0 | 2.7 | 4.4 | 4.4 | 0.0 | 4.3 | 2.6 | 2.6 | 2.6 |
|  | $Na_2O$ | 9.3 | 11.1 | 9.0 | 8.8 | 8.8 | 4.7 | 9.5 | 9.5 | 9.5 | 9.5 |
|  | $La_2O_3$ | 0.0 | 0.0 | 0.0 | 0.0 | 0.0 | 0.0 | 0.0 | 0.0 | 0.0 | 0.0 |
|  | $P_2O_5$ | 3.7 | 3.7 | 5.4 | 5.3 | 5.3 | 0.9 | 5.2 | 5.2 | 5.2 | 5.2 |
|  | Total | 100 | 100 | 100 | 100 | 100 | 100 | 100 | 100.0 | 100.0 | 100.0 |
|  | Tg (° C.) | 610 | 582 | 650 | 703 | 703 | 630 | 686 | 685 | 685 | 685 |
| Phase-separation treatment | Temperature of heat treatment | 900 | 900 | 900 | as cast | 900 | not treated | not treated | not treated | 900 | 950 |
|  | Time for heat treatment | 4 | 4 | 32 | — | 4 | — | — | — | 4 | 4 |
| Transmittance (%) | at wavelength of 800 nm | 79.0 | 11.5 | 31.3 | 52.4 | 51.2 | 20.3 | 59.6 | 54.5 | 45.9 | 43.3 |
|  | at wavelength of 600 nm | 40.2 | 1.4 | 12.8 | 26.7 | 27.8 | 0.6 | 25.8 | 12.7 | 10.0 | 8.0 |
|  | at wavelength of 400 nm | 4.1 | 0.4 | 0.7 | 3.2 | 3.5 | 0.2 | 3.0 | 0.6 | 0.5 | 0.4 |
| CS (MPa)/ DOL (μm) | Ion exchange treatment (400° C., 6 hours) | — | — | — | — | — | — | — | — | — | — |
|  | Ion exchange treatment (400° C., 13 hours) | — | — | — | — | — | — | — | — | — | — |
|  | Ion exchange treatment (450° C., 6 hours) | 576/19 | 480/29 | 620/20 | 734/16 | 718/18 | — | 806/24 | 748/38 | 737/42 | 728/42 |
|  | Ion exchange treatment (450° C., 19 hours) | — | — | — | — | — | — | — | — | — | — |
|  | Chemically strengthening treatment (450° C., 92 hours) | — | — | — | — | — | 445/5 | — | — | — | — |

TABLE 10

|  |  | Examples | | | | | | | | | |
|---|---|---|---|---|---|---|---|---|---|---|---|
|  |  | 10-31 | 10-32 | 10-33 | 10-34 | 10-35 | 10-36 | 10-37 | 10-38 | 10-39 | 10-40 |
| Composition (mol %) | $SiO_2$ | 62.5 | 62.5 | 62.5 | 59.7 | 59.7 | 59.7 | 61.5 | 61.5 | 61.4 | 61.4 |
|  | $Al_2O_3$ | 2.9 | 2.9 | 2.9 | 3.3 | 3.3 | 3.3 | 3.4 | 3.4 | 3.5 | 3.5 |
|  | $B_2O_3$ | 0.0 | 0.0 | 0.0 | 3.9 | 3.9 | 3.9 | 0.0 | 0.0 | 0.0 | 0.0 |
|  | MgO | 15.6 | 15.6 | 15.6 | 14.9 | 14.9 | 14.9 | 15.4 | 15.4 | 15.8 | 15.8 |
|  | $TiO_2$ | 0.0 | 0.0 | 0.0 | 0.0 | 0.0 | 0.0 | 0.0 | 0.0 | 0.0 | 0.0 |
|  | $ZrO_2$ | 4.3 | 4.3 | 4.3 | 4.1 | 4.1 | 4.1 | 4.3 | 4.3 | 4.4 | 4.4 |
|  | $Na_2O$ | 9.2 | 9.2 | 9.2 | 9.1 | 9.1 | 9.1 | 10.3 | 10.3 | 9.6 | 9.6 |
|  | $La_2O_3$ | 0.0 | 0.0 | 0.0 | 0.0 | 0.0 | 0.0 | 0.0 | 0.0 | 0.0 | 0.0 |
|  | $P_2O_5$ | 5.5 | 5.5 | 5.5 | 5.0 | 5.0 | 5.0 | 5.1 | 5.1 | 5.3 | 5.3 |
|  | Total | 100.0 | 100.0 | 100.0 | 100.0 | 100.0 | 100.0 | 100.0 | 100.0 | 100.0 | 100.0 |
|  | Tg (° C.) | 687 | 687 | 687 | 645 | 645 | 645 | 667 | 667 | 680 | 680 |
| Phase-separation treatment | Temperature of heat treatment | not treated | 900 | 950 | not treated | 900 | 950 | not treated | 950 | not treated | 950 |
|  | Time for heat treatment | — | 4 | 4 | — | 4 | 4 | — | 4 | — | 4 |
| Transmittance (%) | at wavelength of 800 nm | 49.9 | 45.4 | 23.8 | 32.6 | 28.0 | 23.5 | 77.9 | 70.9 | 66.2 | 40.4 |
|  | at wavelength of 600 nm | 20.2 | 19.4 | 3.6 | 7.6 | 6.7 | 5.3 | 47.6 | 41.6 | 30.8 | 10.3 |
|  | at wavelength of 400 nm | 1.6 | 1.4 | 0.3 | 0.4 | 0.4 | 0.4 | 14.5 | 11.4 | 4.7 | 0.5 |
| CS (MPa)/ DOL (μm) | Ion exchange treatment (400° C., 6 hours) | — | — | — | 679/12 | 664/12 | 656/12 | 816/13 | 815/13 | — | — |
|  | Ion exchange treatment (400° C., 13 hours) | — | — | — | — | — | — | — | — | — | — |
|  | Ion exchange treatment (450° C., 6 hours) | 743/23 | 728/26 | 728/23 | 701/21 | 692/21 | 690/22 | 851/24 | 834/24 | 797/24 | 783/24 |
|  | Ion exchange treatment (450° C., 19 hours) | — | — | — | — | — | — | — | — | — | — |
|  | Chemically strengthening treatment (450° C., 92 hours) | — | — | — | — | — | — | — | — | — | — |

TABLE 11

| | | Examples | | | | | | | | | |
|---|---|---|---|---|---|---|---|---|---|---|---|
| | | 10-41 | 10-42 | 10-43 | 10-44 | 10-45 | 10-46 | 10-47 | 10-48 | 10-49 | 10-50 |
| Composition (mol %) | $SiO_2$ | 59.4 | 59.4 | 59.2 | 59.2 | 59.2 | 59.2 | 62.3 | 62.3 | 58.2 | 58.2 |
| | $Al_2O_3$ | 3.3 | 3.3 | 3.3 | 3.3 | 3.3 | 3.3 | 3.5 | 3.5 | 3.2 | 3.2 |
| | $B_2O_3$ | 3.9 | 3.9 | 3.8 | 3.8 | 3.8 | 3.8 | 0.0 | 0.0 | 3.8 | 3.8 |
| | MgO | 14.9 | 14.9 | 14.8 | 14.8 | 14.8 | 14.8 | 15.6 | 15.6 | 14.6 | 14.6 |
| | $TiO_2$ | 0.0 | 0.0 | 0.0 | 0.0 | 0.0 | 0.0 | 0.0 | 0.0 | 0.0 | 0.0 |
| | $ZrO_2$ | 4.5 | 4.5 | 4.9 | 4.1 | 4.1 | 4.1 | 3.9 | 3.9 | 4.0 | 4.0 |
| | $Na_2O$ | 9.1 | 9.1 | 9.0 | 9.9 | 9.9 | 9.9 | 9.5 | 9.5 | 11.3 | 11.3 |
| | $La_2O_3$ | 0.0 | 0.0 | 0.0 | 0.0 | 0.0 | 0.0 | 0.0 | 0.0 | 0.0 | 0.0 |
| | $P_2O_5$ | 5.0 | 5.0 | 4.9 | 4.9 | 4.9 | 4.9 | 5.2 | 5.2 | 4.9 | 4.9 |
| | Total | 100.0 | 100.0 | 100.0 | 100.0 | 100.0 | 100.0 | 100.0 | 100.0 | 100.0 | 100.0 |
| | Tg (° C.) | 634 | — | 638.8 | 621.6 | — | — | 700 | — | 615 | — |
| Phase-separation treatment | Temperature of heat treatment | not treated | 900 | not treated | not treated | 900 | 950 | not treated | 900 | not treated | 900 |
| | Time for heat treatment | — | 4 | — | — | 4 | 4 | — | 4 | — | 4 |
| Transmittance (%) | at wavelength of 800 nm | 41.2 | 30.5 | 40.2 | 48.2 | 46.7 | 37.5 | 56.4 | 55.7 | 80.1 | 72.0 |
| | at wavelength of 600 nm | 10.2 | 7.5 | 10.4 | 17.9 | 17.7 | 13.7 | 23.1 | 23.9 | 53.0 | 45.5 |
| | at wavelength of 400 nm | 0.5 | 0.4 | 0.5 | 1.2 | 1.3 | 0.8 | 2.3 | 2.5 | 18.8 | 13.8 |
| CS (MPa)/ DOL (μm) | Ion exchange treatment (400° C., 6 hours) | — | — | — | — | — | — | — | — | — | — |
| | Ion exchange treatment (400° C., 13 hours) | — | — | — | — | — | — | — | — | — | — |
| | Ion exchange treatment (450° C., 6 hours) | 726/21 | 718/21 | 737/19 | 755/20 | 749/20 | 731/20 | 774/25 | 759/25 | 854/19 | 843/19 |
| | Ion exchange treatment (450° C., 19 hours) | — | — | — | — | — | — | — | — | — | — |
| | Chemically strengthening treatment (450° C., 92 hours) | — | — | — | — | — | — | — | — | — | — |

TABLE 12

| | | Examples | | | | | | | | | |
|---|---|---|---|---|---|---|---|---|---|---|---|
| | | 10-51 | 10-52 | 10-53 | 10-54 | 10-55 | 10-56 | 10-57 | 10-58 | 10-59 | 10-60 |
| Composition (mol %) | $SiO_2$ | 58.2 | 57.3 | 57.3 | 57.7 | 57.7 | 57.7 | 57.3 | 57.3 | 57.3 | 61.0 |
| | $Al_2O_3$ | 3.2 | 3.2 | 3.2 | 4.0 | 4.0 | 4.0 | 4.8 | 4.8 | 4.8 | 5.1 |
| | $B_2O_3$ | 3.8 | 3.7 | 3.7 | 3.8 | 3.8 | 3.8 | 3.7 | 3.7 | 3.7 | 0.0 |
| | MgO | 14.6 | 14.3 | 14.3 | 14.4 | 14.4 | 14.4 | 14.3 | 14.3 | 14.3 | 15.3 |
| | $TiO_2$ | 0.0 | 0.0 | 0.0 | 0.0 | 0.0 | 0.0 | 0.0 | 0.0 | 0.0 | 0.0 |
| | $ZrO_2$ | 4.0 | 4.0 | 4.0 | 4.0 | 4.0 | 4.0 | 4.0 | 4.0 | 4.0 | 2.5 |
| | $Na_2O$ | 11.3 | 12.7 | 12.7 | 11.2 | 11.2 | 11.2 | 11.1 | 11.1 | 11.1 | 11.0 |
| | $La_2O_3$ | 0.0 | 0.0 | 0.0 | 0.0 | 0.0 | 0.0 | 0.0 | 0.0 | 0.0 | 0.0 |
| | $P_2O_5$ | 4.9 | 4.8 | 4.8 | 4.8 | 4.8 | 4.8 | 4.8 | 4.8 | 4.8 | 5.1 |
| | Total | 100.0 | 100.0 | 100.0 | 100.0 | 100.0 | 100.0 | 100.0 | 100.0 | 100.0 | 100.0 |
| | Tg (° C.) | — | 597 | — | 622 | — | — | 614 | — | — | 646 |
| Phase-separation treatment | Temperature of heat treatment | 950 | not treated | 900 | not treated | 900 | 950 | not treated | 900 | 950 | not treated |
| | Time for heat treatment | 4 | — | 4 | — | 4 | 4 | — | 4 | 4 | — |
| Transmittance (%) | at wavelength of 800 nm | 57.5 | 91.4 | 66.8 | 79.7 | 70.0 | 57.8 | 77.1 | 67.1 | 53.0 | 77.8 |
| | at wavelength of 600 nm | 33.7 | 83.5 | 44.6 | 48.6 | 39.1 | 31.8 | 40.6 | 30.7 | 23.5 | 40.1 |
| | at wavelength of 400 nm | 6.1 | 60.3 | 15.0 | 13.3 | 8.8 | 4.9 | 7.1 | 4.3 | 2.3 | 6.6 |
| CS (MPa)/ DOL (μm) | Ion exchange treatment (400° C., 6 hours) | — | — | — | — | — | — | — | — | — | — |
| | Ion exchange treatment (400° C., 13 hours) | — | — | — | — | — | — | — | — | — | — |
| | Ion exchange treatment (450° C., 6 hours) | 842/19 | 911/18 | 881/18 | 864/21 | 855/23 | 851/23 | 874/25 | 860/26 | 865/26 | 843/36 |
| | Ion exchange treatment (450° C., 19 hours) | — | — | — | — | — | — | — | — | — | — |
| | Chemically strengthening treatment (450° C., 92 hours) | — | — | — | — | — | — | — | — | — | — |

TABLE 13

| | | Examples | | | | | | | | | |
|---|---|---|---|---|---|---|---|---|---|---|---|
| | | 10-61 | 10-62 | 10-63 | 10-64 | 10-65 | 10-66 | 10-67 | 10-68 | 10-69 | 10-70 |
| Composition (mol %) | $SiO_2$ | 61.0 | 61.0 | 59.7 | 59.7 | 59.7 | 60.7 | 60.7 | 58.7 | 60.2 | 60.2 |
| | $Al_2O_3$ | 5.1 | 5.1 | 5.0 | 5.0 | 5.0 | 3.4 | 3.4 | 4.9 | 3.3 | 3.3 |
| | $B_2O_3$ | 0.0 | 0.0 | 3.9 | 3.9 | 3.9 | 3.9 | 3.9 | 3.8 | 3.9 | 3.9 |
| | MgO | 15.3 | 15.3 | 14.9 | 14.9 | 14.9 | 15.2 | 15.2 | 14.7 | 15.0 | 15.0 |
| | $TiO_2$ | 0.0 | 0.0 | 0.0 | 0.0 | 0.0 | 0.0 | 0.0 | 0.0 | 0.0 | 0.0 |
| | $ZrO_2$ | 2.5 | 2.5 | 2.5 | 2.5 | 2.5 | 2.5 | 2.5 | 4.1 | 4.2 | 4.2 |
| | $Na_2O$ | 11.0 | 11.0 | 9.1 | 9.1 | 9.1 | 9.3 | 9.3 | 9.0 | 9.2 | 9.2 |
| | $La_2O_3$ | 0.0 | 0.0 | 0.0 | 0.0 | 0.0 | 0.0 | 0.0 | 0.0 | 0.0 | 0.0 |
| | $P_2O_5$ | 5.1 | 5.1 | 5.0 | 5.0 | 5.0 | 5.1 | 5.1 | 4.9 | 4.2 | 4.2 |
| | Total | 100.0 | 100.0 | 100.0 | 100.0 | 100.0 | 100.0 | 100.0 | 100.0 | 100.0 | 100.0 |
| | Tg (° C.) | — | — | 624 | — | — | 614 | — | 667 | — | — |
| Phase-separation treatment | Temperature of heat treatment | 900 | 950 | not treated | 900 | 950 | not treated | 900 | not treated | 900 | 950 |
| | Time for heat treatment | 4 | 4 | — | 4 | 4 | — | 4 | — | 4 | 4 |
| Transmittance (%) | at wavelength of 800 nm | 73.8 | 64.9 | 19.3 | 19.0 | 17.0 | 20.4 | 18.1 | 28.1 | 57.3 | 41.3 |
| | at wavelength of 600 nm | 34.7 | 28.0 | 2.2 | 2.2 | 1.9 | 4.3 | 3.5 | 1.5 | 17.0 | 11.5 |
| | at wavelength of 400 nm | 5.0 | 3.3 | 0.3 | 0.3 | 0.3 | 0.4 | 0.4 | 0.2 | 1.0 | 0.6 |
| CS (MPa)/ DOL (μm) | Ion exchange treatment (400° C., 6 hours) | — | — | — | — | — | — | — | — | — | — |
| | Ion exchange treatment (400° C., 13 hours) | — | — | — | — | — | — | — | — | — | — |
| | Ion exchange treatment (450° C., 6 hours) | 831/36 | 829/56 | 674/32 | 665/32 | 667/32 | 652/22 | 644/24 | 647/29 | 712/20 | 725/21 |
| | Ion exchange treatment (450° C., 19 hours) | — | — | — | — | — | — | — | — | — | — |
| | Chemically strengthening treatment (450° C., 92 hours) | — | — | — | — | — | — | — | — | — | — |

As listed in Tables 7 to 13, it was found that the phase-separated glass to which the ion exchange treatment was applied had a shielding property suitable for a housing of electronic device and excellent strength.

Example 11

The raw materials with the compositions listed in Table 14 were melted at a temperature of 1650° C. Sodium sulfate in a weight equivalent to 0.4% of the mass was added to the compositions listed in Table 14. The phase-separated glass in the spinodal state was confirmed in all Examples 11-1 to 11-3.

In the phase-separated glass, the glass transition temperature (Tg), the conditions of the phase-separation heat treatment, the transmittance, the surface compressive stress (CS), the depth of the compressive stress, and the fracture strength with indenter insertion load of 0 kg and 2 kg in the three-point bending strength test are listed in Table 14. The values between parentheses are assumed values. In Table 14, the examples 11-1 to 11-3 are Examples.

Further, the results of observing the glass of the example 11-2 in which a Vickers or an indenter having a form of a square pyramid having a facing angle of 110° was inserted into the glass with the load in the range of 0.5 kg to 10 kg are illustrated in FIG. 12 (phase-separated glass, spinodal).

TABLE 14

| | | Example 11-1 | Example 11-2 | Example 11-3 |
|---|---|---|---|---|
| Composition (mol %) | $Na_2O$ | 12 | 12 | 12 |
| | CaO | 4 | 4 | 4 |
| | $SiO_2$ | 84 | 84 | 84 |
| | Total | 100 | 100 | 100 |
| | Tg [° C.] | (550) | (550) | (550) |
| Phase-separation treatment | Temperature of heat treatment (° C.) | 700 | 700 | 700 |
| | Time for heat treatment (hour) | 4 | 10 | 24 |
| Transmittance (%) | at wavelength of 800 nm | 83.6 | 57.4 | 29.3 |
| | at wavelength of 600 nm | 54.6 | 18.7 | 6.3 |
| | at wavelength of 400 nm | 3.9 | 0.6 | 0.4 |
| CS (MPa)/DOL (μm) | Ion exchange treatment: 400° C., 4 hours | 437/ 16 | 437/ 16 | 433/ 17 |
| Three-point bending strength [fracture strength (MPa)] | Indenter insertion load (0 kg) | (350) | (350) | (346) |
| | Indenter insertion load (2 kg) | (175) | (175) | (173) |

As listed in Table 14 and FIG. 12, it is found that the chemically strengthened glass obtained by applying the ion exchange treatment to the phase-separated glass in the spinodal state has a shielding property suitable for a housing of electronic device similarly to the case of the phase-separated glass in the binodal state and has strength sufficient for a housing of electronic device because the sufficient surface compressive stress and the sufficient compressive stress layer depth can be provided by the chemically strengthening process.

While the invention has been described in detail and with reference to specific embodiments thereof, it will be apparent to one skilled in the art that various changes and modifications can be made therein without departing from the spirit and scope thereof. This application is based on Japanese Patent Application No. 2012-104059 filed on Apr. 27, 2012 and Japanese Patent Application No. 2012-242555 filed on Nov. 2, 2012, the entire subject matters of which are incorporated herein by reference.

REFERENCE SIGNS LIST

10: Chemically strengthened glass
10a: Upper surface
11: Base
12: Sandpaper
12a: Abrasive surface
13: Spherical object
O: Fracture origin
C: Crack

The invention claimed is:

1. A phase-separated glass comprising a compressive stress layer in a surface thereof, which has a surface compressive stress of 300 MPa or more and a tensile stress of 50 MPa or less.

2. The phase-separated glass according to claim 1, wherein a linear transmittance at a wavelength of 400 nm is 30% or less in terms of a thickness of 1 mm, and a total light reflectance at the same wavelength is 10% or more in terms of a thickness of 1 mm.

3. An electronic device housing, comprising the phase-separated glass according to claim 2.

4. The phase-separated glass according to claim 1, which is in a binodal state which has a shape in which one separated phase in a form of an independent spherical shape is dispersed in a matrix of another separated phase, wherein an average diameter of the separated phase which is dispersed in a form of an independent spherical shape is 40 nm to 3000 nm.

5. A process for producing the phase-separated glass according to claim 4, comprising heating a glass for 24 hours or less for phase-separation of the glass.

6. A phase-separated glass, wherein, in a three-point bending strength test, a value obtained by dividing a value obtained by subtracting a three-point bending strength in 2 kg of Vickers indenter insertion load from a three-point bending strength in 0 kg of Vickers indenter insertion load by the three-point bending strength in 0 kg of Vickers indenter insertion load is 70% or less.

7. The phase-separated glass according to claim 6, wherein a linear transmittance at a wavelength of 400 nm is 30% or less in terms of a thickness of 1 mm, and a total light reflectance at the same wavelength is 10% or more in terms of a thickness of 1 mm.

8. An electronic device housing, comprising the phase-separated glass according to claim 7.

9. The phase-separated glass according to claim 6, which is in a binodal state which has a shape in which one separated phase in a form of an independent spherical shape is dispersed in a matrix of another separated phase, wherein an average diameter of the separated phase which is dispersed in a form of an independent spherical shape is 40 nm to 3000 nm.

10. A process for producing the phase-separated glass according to claim 9, comprising heating a glass for 24 hours or less for phase-separation of the glass.

11. A phase-separated glass which is not fractured when a Vickers indenter is inserted with a load of 19.6 N.

12. The phase-separated glass according to claim 11, wherein a linear transmittance at a wavelength of 400 nm is 30% or less in terms of a thickness of 1 mm, and a total light reflectance at the same wavelength is 10% or more in terms of a thickness of 1 mm.

13. An electronic device housing, comprising the phase-separated glass according to claim 12.

14. The phase-separated glass according to claim 11, which is in a binodal state which has a shape in which one separated phase in a form of an independent spherical shape is dispersed in a matrix of another separated phase, wherein an average diameter of the separated phase which is dispersed in a form of an independent spherical shape is 40 nm to 3000 nm.

15. A process for producing the phase-separated glass according to claim 14, comprising heating a glass for 24 hours or less for phase-separation of the glass.

16. A phase-separated glass, wherein an average falling ball height at a time of fracture is 8 cm or more in a sandpaper falling ball test in which a spherical object which is made of 29 g of stainless steel and has a diameter of 19.1 mm is dropped from an upper side in a state where the phase-separated glass is placed on a base made of granite and an upper surface of the phase-separated glass is brought into contact with an abrasive surface of a sandpaper of P30 (JIS 86252: 2006).

17. The phase-separated glass according to claim 16, wherein a linear transmittance at a wavelength of 400 nm is 30% or less in terms of a thickness of 1 mm, and a total light reflectance at the same wavelength is 10% or more in terms of a thickness of 1 mm.

18. An electronic device housing, comprising the phase-separated glass according to claim 17.

19. The phase-separated glass according to claim 16, which is in a binodal state which has a shape in which one separated phase in a form of an independent spherical shape is dispersed in a matrix of another separated phase, wherein an average diameter of the separated phase which is dispersed in a form of an independent spherical shape is 40 nm to 3000 nm.

20. A process for producing the phase-separated glass according to claim 19, comprising heating a glass for 24 hours or less for phase-separation of the glass.

* * * * *